(12) United States Patent
Liaw

(10) Patent No.: US 8,908,421 B2
(45) Date of Patent: Dec. 9, 2014

(54) METHODS AND APPARATUS FOR FINFET SRAM ARRAYS IN INTEGRATED CIRCUITS

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/177,521

(22) Filed: Feb. 11, 2014

(65) Prior Publication Data

US 2014/0153321 A1 Jun. 5, 2014

Related U.S. Application Data

(62) Division of application No. 13/312,810, filed on Dec. 6, 2011, now Pat. No. 8,693,235.

(51) Int. Cl.
G11C 11/00 (2006.01)
G11C 11/412 (2006.01)
G11C 11/413 (2006.01)
H01L 27/12 (2006.01)
H01L 27/02 (2006.01)
H01L 29/66 (2006.01)
H01L 29/78 (2006.01)

(52) U.S. Cl.
CPC ............ *G11C 11/412* (2013.01); *G11C 11/413* (2013.01); *H01L 27/1211* (2013.01); *H01L 27/0207* (2013.01); *H01L 29/66795* (2013.01); *H01L 29/785* (2013.01)

USPC ............... 365/154; 365/156; 365/72; 365/63; 365/226

(58) Field of Classification Search
CPC ............ H01L 27/1211; H01L 27/0207; H01L 29/66795; H01L 29/785; H01L 21/845
USPC ............................. 365/154, 156, 63, 72, 226
See application file for complete search history.

(56) References Cited

U.S. PATENT DOCUMENTS 6,737,685 B2   5/2004   Aipperspach et al.
6,922,354 B2   7/2005   Ishikura et al.
(Continued)

FOREIGN PATENT DOCUMENTS

JP   2007509490      4/2007
KR   100675290       1/2007
KR   1020080080933   9/2008

*Primary Examiner* — Viet Q Nguyen
(74) *Attorney, Agent, or Firm* — Slater & Matsil, L.L.P.

(57) ABSTRACT

Methods and apparatus for providing single finFET and multiple finFET SRAM arrays on a single integrated circuit are provided. A first single port SRAM array of a plurality of first bit cells is described, each first bit cell having a y pitch Y1 and an X pitch X1, the ratio of X1 to Y1 being greater than or equal to 2, each bit cell further having single fin finFET transistors to form a 6T SRAM cell and a first voltage control circuit; and a second single port SRAM array of a plurality of second bit cells, each second bit cell having a y pitch Y2 and an X pitch X2, the ratio of X2 to Y2 being greater than or equal to 3, each of the plurality of second bit cells comprising a 6T SRAM cell wherein the ratio of X2 to X1 is greater than about 1.1.

20 Claims, 16 Drawing Sheets

(56) References Cited

U.S. PATENT DOCUMENTS

| | | |
|---|---|---|
| 6,924,560 B2 | 8/2005 | Wang et al. |
| 6,967,351 B2 | 11/2005 | Fried et al. |
| 6,970,373 B2 * | 11/2005 | Datta et al. ............ 365/154 |
| 7,138,305 B2 * | 11/2006 | Datta et al. ............ 438/157 |
| 7,164,175 B2 | 1/2007 | Kawasaki et al. |
| 7,177,177 B2 | 2/2007 | Chuang et al. |
| 7,271,451 B2 | 9/2007 | Liaw |
| 7,348,284 B2 | 3/2008 | Doyle et al. |
| 7,471,545 B2 | 12/2008 | Nii |
| 7,547,947 B2 | 6/2009 | Anderson et al. |
| 7,592,675 B2 | 9/2009 | Liaw |
| 7,812,373 B2 | 10/2010 | Bauer et al. |
| 7,852,661 B2 | 12/2010 | Liu |
| 7,898,041 B2 | 3/2011 | Radosavljevic et al. |
| 7,915,691 B2 | 3/2011 | Wong et al. |
| 7,994,583 B2 | 8/2011 | Inaba |
| 8,028,264 B2 | 9/2011 | Shimada et al. |
| 8,059,452 B2 | 11/2011 | Liaw |
| 8,076,236 B2 | 12/2011 | Schultz et al. |
| 8,129,798 B2 | 3/2012 | Inaba |
| 8,144,868 B2 | 3/2012 | Hauge et al. |
| 8,174,868 B2 | 5/2012 | Liaw |
| 8,198,655 B1 | 6/2012 | Pileggi et al. |
| 8,273,617 B2 | 9/2012 | Thompson et al. |
| 8,315,084 B2 | 11/2012 | Liaw et al. |
| 8,338,870 B2 | 12/2012 | Kim |
| 8,362,566 B2 * | 1/2013 | Rakshit et al. ............ 257/368 |
| 8,391,093 B2 | 3/2013 | Asayama |
| 8,399,931 B2 | 3/2013 | Liaw et al. |
| 8,472,227 B2 | 6/2013 | Liaw |
| 8,525,267 B2 * | 9/2013 | Wang et al. ............ 257/365 |
| 8,582,352 B2 * | 11/2013 | Liaw ............ 365/154 |
| 8,693,235 B2 * | 4/2014 | Liaw ............ 365/154 |
| 8,759,916 B2 * | 6/2014 | Bryant et al. ............ 257/345 |
| 2007/0114612 A1 | 5/2007 | Ahn et al. |
| 2008/0212392 A1 | 9/2008 | Bauer |
| 2011/0075470 A1 | 3/2011 | Liaw |

* cited by examiner

METHODS AND APPARATUS FOR FINFET SRAM ARRAYS IN INTEGRATED CIRCUITS

This application is a divisional of U.S. patent application Ser. No. 13/312,810, entitled "Methods and Apparatus for FinFET SRAM Arrays in Integrated Circuits," filed on Dec. 6, 2011, which application is incorporated herein by reference.

RELATED APPLICATIONS

This application is related to U.S. application Ser. No. 13/312,828, entitled "Methods and Apparatus for finFET SRAM Cells," filed Dec. 6, 2011, which is hereby incorporated in its entirety herein by reference.

BACKGROUND

Static random access memory ("SRAM") arrays are commonly used for storage on integrated circuit devices. Recent advances in finFET transistor technology have made advanced SRAM cells using finFET transistors possible. In contrast to the prior planar MOS transistor, which has a channel formed at the surface of a semiconductor substrate, a finFET has a three dimensional channel region. In the finFET, the channel for the transistor is formed on the sides, and sometimes also the top, of a "fin" of semiconductor material. The gate, typically a polysilicon or metal gate, extends over the fin and a gate dielectric is disposed between the gate and the fin. The three-dimensional shape of the finFET channel region allows for an increased gate width without increased silicon area, even as the overall scale of the devices is reduced with semiconductor process scaling and in conjunction with a reduced gate length; providing a reasonable channel width characteristic at a low silicon area cost.

However, when an SRAM cell is formed using single fin finFET transistors for the pull up or "PU" transistors and also the pass gate "PG" transistors, the "alpha ratio" of the on current ("Ion") for the PU and PG transistors, that is the ratio PU_Ion/PG_Ion, is negatively impacted. The SRAM cells formed of these transistors may therefore exhibit a poor write margin metric, and the amount that the cell positive supply voltage Vcc can be lowered ("Vcc_min") while maintaining proper operation will be reduced. A reduced Vcc_min metric negatively impacts the power consumption for an integrated circuit using the SRAM cells. In the known approaches, solutions such as threshold voltage ("Vt") tuning and gate length skew adjustments of certain ones of the finFET devices are used to increase performance of the SRAM cells. However, these approaches suffer from additional lithography or added ion implants, increase costs in the manufacturing process, and may create critical dimension or cell size concerns.

In some applications the primary goal of an SRAM array for use in an integrated circuit is the silicon area used per stored bit, which needs to be reduced as much as possible. However, in cases when SRAM storage is used for high speed data access, as in cache storage for a microprocessor such as level one ("L1") or level two ("L2") on-board cache, access speed is also very important. For these GHz speed cache SRAMs the cells may be formed of larger width transistor devices in order to increase the transistor drive currents and operation speed. Use of Vt or other process adjustments now used to provide these devices with higher drive current creates additional processing costs and manufacturing problems.

BRIEF DESCRIPTION OF THE DRAWINGS

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed concepts of the application, and do not limit the scope of the disclosure and do not limit the scope of the appended claims.

Embodiments of the present application, examples of which are now described in detail, provide novel methods and apparatus for manufacturing integrated circuits including both a high density, single fin finFET SRAM cell array and a high speed, multiple fin finFET SRAM cell array to be fabricated within a single integrated circuit. Manufacture of the devices is performed without added process steps and without added photolithographic complexity, and both types of SRAM cell arrays are formed of finFET devices in a common process without need for Vt adjustments, customized channel or gate length devices, or implant adjustments.

In an embodiment, a first type SRAM cell array is provided using single fin finFET transistors for all transistors within the cells. Both a single port SRAM cell with 6 transistors ("6T") and a dual port SRAM cell with 8 transistors ("8T") are disclosed as alternative embodiments. A second type SRAM cell for higher speed SRAM arrays is also provided. In the embodiments, the second type SRAM cell provides higher drive current for certain transistors by using multiple fin fin- FET transistors. The multiple fin finFET transistors provide higher drive current for the pass gate and pull down devices in the SRAM cells. In embodiments, the multiple fin finFETs have two, three or more fins to provide parallel connected finFET transistors. In some embodiments, the pull up transistors remain single fin finFET devices. The embodiments provide an improved alpha ratio through increasing the PG_Ion current, thus improving the write margin for the cells. By using both of the first and second type SRAM cell arrays in a single integrated circuit, the performance required for both high speed SRAM arrays and high density SRAM arrays can be met on the same device using a common process and straightforward manufacturing steps, without added manufacturing costs for extra photolithographic steps such as implant adjustments.

Figure 1:
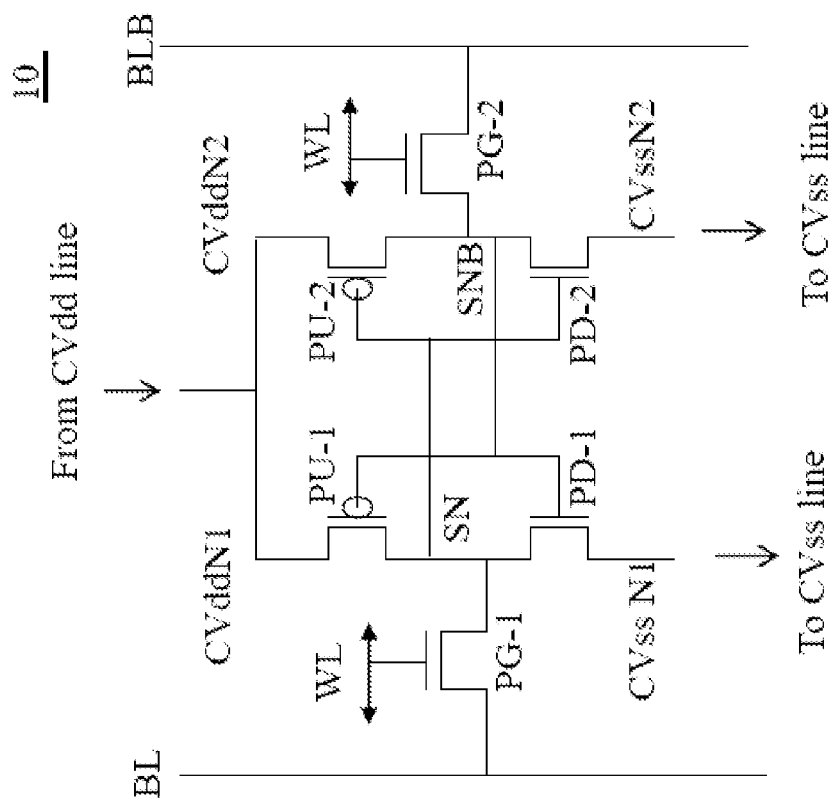
FIG. 1 depicts in a simplified circuit schematic an SRAM cell for use with the embodiments.

FIG. 1 depicts in a simple circuit diagram a 6T SRAM cell 10 for use with the embodiments. In FIG. 1, the cell 10 stores data in true and complementary form on storage nodes labeled "SN" and "SNB". Bit lines (sometimes called "digit" lines) send and receive data from the SRAM cell in true and complementary form on the bit line labeled "BL" and bit line bar labeled "BLB". In an SRAM array using the 6T cells 10, the cells are arranged in rows and columns and the columns typically are formed by the bit line pairs, with the cells disposed between the respective bit line pairs. The pass gate transistors PG-1 and PG-2 provide access to the storage nodes of the SRAM cell during read and write operations, and couple the storage nodes to the bit lines responsive to a voltage on the word line "WL".

The storage portion of the SRAM circuit is formed of four transistors that make a cross coupled pair of CMOS inverters. Pull up transistor PU-1 and pull down transistor PD-1 form one inverter with an output at the storage node SN. Pull up transistor PU-2 and pull down transistor PD-2 form another inverter with the output at storage node SNB. The input of the first inverter is node SNB, coupled to the gates of the transistors PU-1 and PD-1, and the input of the second inverter is node SN, coupled to the gates of transistors PU-2 and PD-2. The pull up transistors PU-1 and PU-2 may be p-type transistors as shown; when the gate terminal of these p-type transistors is below a threshold voltage, these transistors will turn on and couple the cell positive voltage supply labeled "CVdd" to the respective storage node, thereby "pulling up" on the node at the output. The pull down transistors are typically n-type transistors and when the gate voltage exceeds a predetermined threshold voltage, the pull down transistors turn on and couple the respective storage node to the ground or Vss supply labeled "CVss" for "cell Vss". The voltage supplies will be coupled to the cell at the nodes labeled CVddN1, CVddN2, for CVdd, and CVssN1, CVssN2, for CVss.

In operation, if the pass gats PG1 and PG2 are inactive, the SRAM cell 10 will maintain the complementary values at nodes SN and SNB indefinitely. This is so because each inverter of the pair of cross coupled inverters drives the input of the other, thereby maintaining the voltages at the storage nodes. This situation will remain stable until the power is removed from the SRAM, or, a write cycle is performed changing the stored data.

During a write cycle, the word line WL will become active (typically, a logic one or "high" voltage) and turn on the pass gates PG1 and PG2, coupling the storage nodes SN, SNB to the respective bit lines. If storage node SN is a "logic one" or high voltage, and the bit line voltage BL is a "zero", or low voltage, then the pass gate transistor PG-1 and the bit line BL will be discharging the storage node SN, in opposition to the action of the pull up transistor PU-1. Meanwhile, the complementary data on bit line BLB will be a "one" or high voltage, which will be coupled to the "low" voltage or "zero" stored at node SNB. Thus the pull down transistor PD-2 will be trying to pull down on the bit line BLB. As the storage node SNB rises, the pull up transistor PU-1 will cut off, and similarly, as the storage node SN value falls (due to the discharge through the pass gate PG-1), the pull down transistor PD-2 will cut off, similarly pull up transistor PU-1 will turn on and storage node SN will rise to a "one" or high voltage. So during write cycles, the pull up transistors PU-1 and PU-2 may be coupled so as to oppose the pass gate transistors PG-1 and PG-2 when the stored data switches, which is why the "alpha" ratio is important for write access times. If the write data presented on the true and complementary bit line pair differs from the data already stored in the SRAM cell, the pass gates PG-1, PG2, must be able to overcome the "pull up" of the transistors PU-1 and PU-2 during writes.

During a read cycle, the bit line and bit line bar BL, BLB may be placed at an intermediate voltage or a high voltage in a "precharge" operation. However during read cycles the bit lines are initially not actively driven. The word line WL then goes active and couples the respective bit lines to the storage nodes SN and SNB. One of the two storage nodes will be a logic "zero" or low voltage, which means one of the pull down transistors PD-1 or PD-2 will be coupled to a bit line through the pass gates PG-1 or PG-2, and that pull down transistor will need to discharge that bit line in order to pull it down. So the drive strength of the pull down transistors affects read access time. In contrast, if the bit line is a precharged voltage which is a logic "one", and the corresponding stored value is a logic "one", the pull up transistor PU-1 or PU-2 that is coupled to that bit line only has to maintain the voltage on the bit line; so it can be seen that the drive strength of the pull up transistors is not as critical to the read access time.

Figure 2:
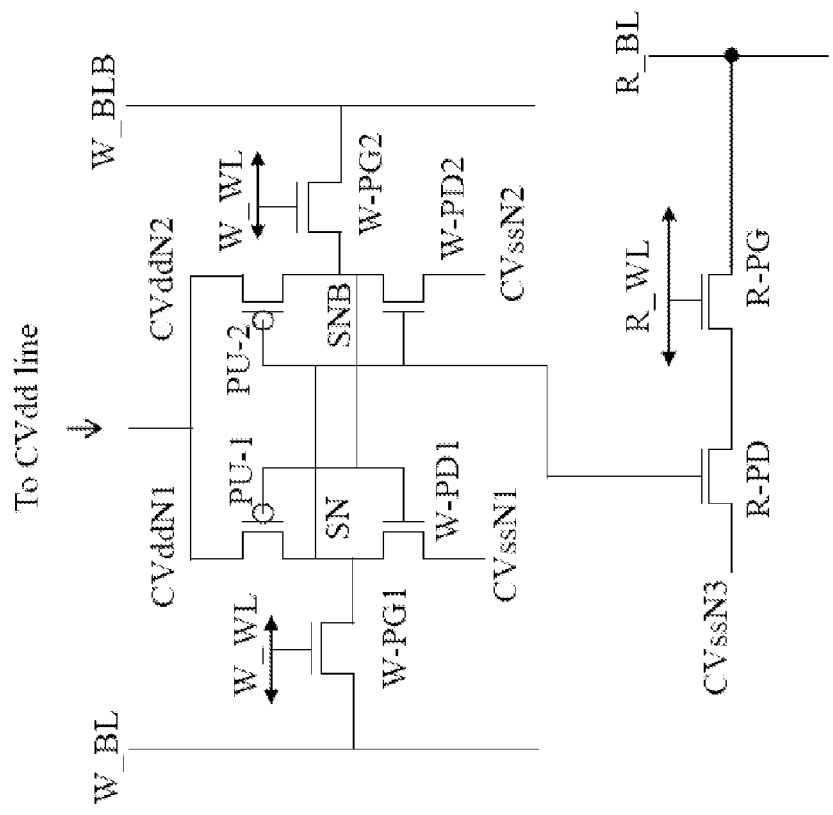
FIG. 2 depicts in another simplified circuit schematic an alternative SRAM cell for use with the embodiments.

In an alternative SRAM cell circuit arrangement, a dual port SRAM cell may be used with the embodiments. FIG. 2 depicts, in a simplified circuit diagram, a dual port SRAM cell 12. Again the 6T SRAM cell of FIG. 1 is provided generally in the same manner as for FIG. 1, but now the bit lines described above are used only for write operations and are labeled W_BL and W_BLB. A dedicated write word line W_WL is provided to couple the write bit lines W_BL and W_BLB to the storage nodes SN and SNB of the SRAM cell. The transistors are labeled W-PG1 for write pass gate 1, W-PG2 for write pass gate 2, W-PD1 for write pull down transistor 1, W-PD2 for write pull down transistor 2. The write word line is labeled W_WL.

For storage and writing, the SRAM cell 12 operates as described above for the 6T cell 10 in FIG. 1. During a write operation, the word line W_WL couples the write bit line pair of W_BL and W_BLB to the respective storage nodes SN and SNB in the SRAM cell 12. The data stored will be retained so long as the power is supplied to the cell via the cell positive supply CVdd and the ground or Vss supply CVss at nodes CVddN1, CVddN2, CVssN1, and CVssN2.

Read operations are different in this embodiment, which has a dedicated read bit line labeled R_BL. The use of a dedicated read bit line allows a small signal sense amplifier to be used to amplify a small read output signal on R_BL to a full logic level at the output of the SRAM array. The SRAM cell is no longer directly coupled to the output bit line during reads, allowing a smaller load on the pull up transistors, and thus, enabling a lower Vcc_min to be used. In this embodiment, the storage node SN is coupled to the gate of transistor R-PD, which is a pull down transistor, typically an n-type device. A node CVssN3 is coupled to a ground or Vss voltage. During a read operation, the read word line R_WL becomes active, enabling the pass gate R-PG to couple the read bit line R_BL to the pull down device R_PD. The storage node SN is coupled to the R_PD transistor gate, and not to the bit line, enabling faster operation and lower voltage levels in the SRAM cell. The added read port requires two additional transistors, and a dedicated read bit line that runs through the column of cells. However the dedicate read port also increases bandwidth as well as providing a lower operation voltage (a lower Vcc_min) for the SRAM cells.

Figure 3:
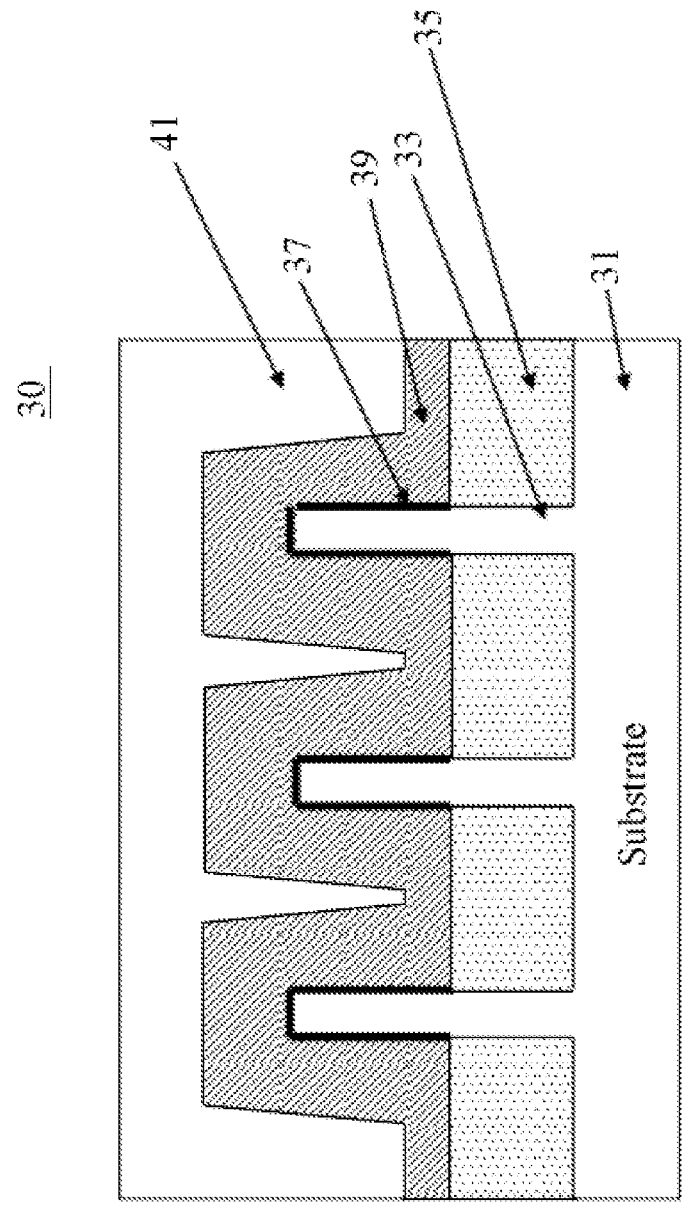
FIG. 3 depicts in a cross sectional view a bulk multiple fin finFET device for use with the embodiments.

FIG. 3 depicts in a cross-sectional view a multiple fin finFET device 30 that may be used with the embodiments. In FIG. 3, a semiconductor substrate 31 is shown. In this "bulk fin" arrangement, the fins 33 are formed of the semiconductor material. The fins 33 may be formed, for example, by photolithographic pattern and etch processes to remove semiconductor material from the substrate 31. A field oxide or other dielectric 35 is shown deposited on the substrate surface and extending partially up the sides of the fins 33. A gate dielectric 37 is shown formed on the vertical sides and the top of the fins 33. A gate 39 is shown deposited over the fins 33 and the dielectric 37. An active region is formed at the top surface, and along the vertical sides, of each of the fins 33. The common gate 39 extends over the three fins. If the three fins are further coupled together in parallel, a single finFET transistor may be formed; alternatively, three single fin finFET transistors having a common gate connection could be formed using the structure shown in FIG. 3. An interlevel dielectric material 41 is shown deposited over the gate material. The gate 39 may be doped polysilicon, for example. Silicide may be formed over the gate 39 to reduce resistance. Metal gate material may be used for gate 39 in place of or in combination with the polysilicon. The gate dielectric 37 may be an oxide, nitride, high-k or low-k material for gate dielectrics. Multiple layers of dielectric material may be used for the gate dielectric, the field oxide, or the interlayer dielectric as is known. The fins 33 may be doped to form source and drain regions outside the channel areas covered by the gate 39 and thereby form FET transistors. Alternatively, the fins may form depletion mode transistors having uniformly doped fins.

Figure 4:
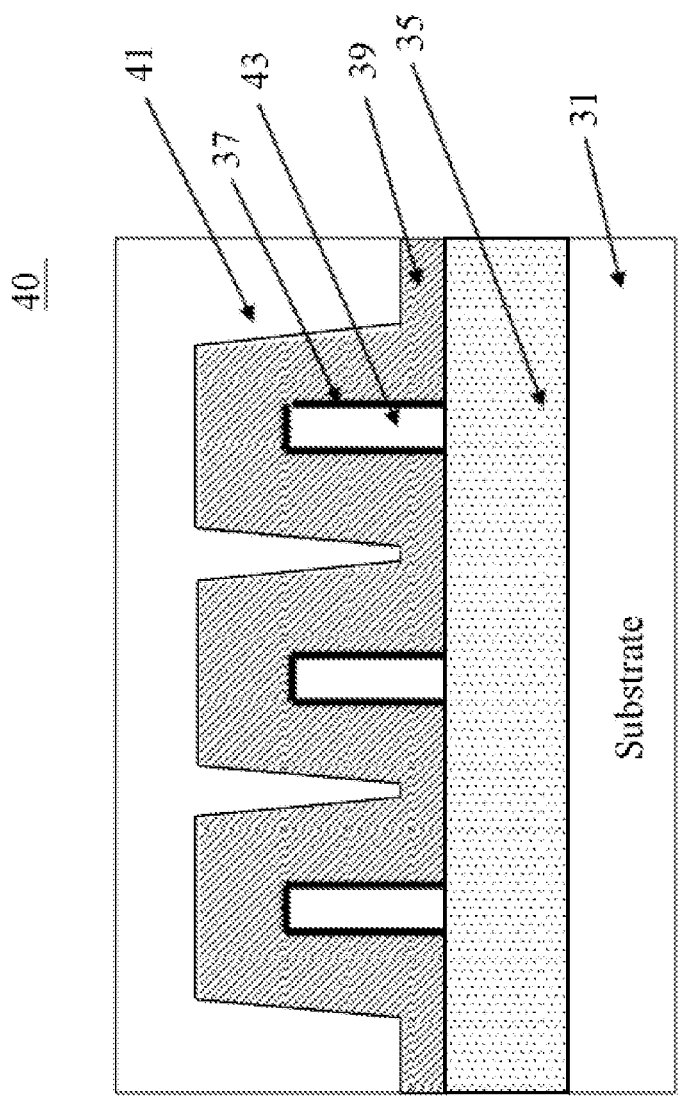
FIG. 4 depicts in a cross sectional view a silicon-on-insulator multiple fin finFET device for use with the embodiments.

In an alternative embodiment, FIG. 4 depicts in a cross-sectional view a silicon-on-insulator or "SOI" embodiment finFET transistor 40. In FIG. 4 several elements are the same as in FIG. 3 and common reference numerals are used for those elements. Substrate 31 which may be a semiconductor substrate or other substrate including as non-limiting examples silicon, germanium, and the like, is shown with a field oxide or other dielectric 35 deposited over it. Epitaxially grown fins 43 are shown formed on the surface of the insulator 35. The gate dielectric 37, gate 39, and interlevel dielectric 41 are disposed generally as in FIG. 3. The use of the SOI fins makes processing different for forming the fins, however the remaining elements may be formed in the same manner as for the embodiment of FIG. 3; and either the bulk fin or SOI fin approach may be used with the SRAM array cells described below.

Figure 5:
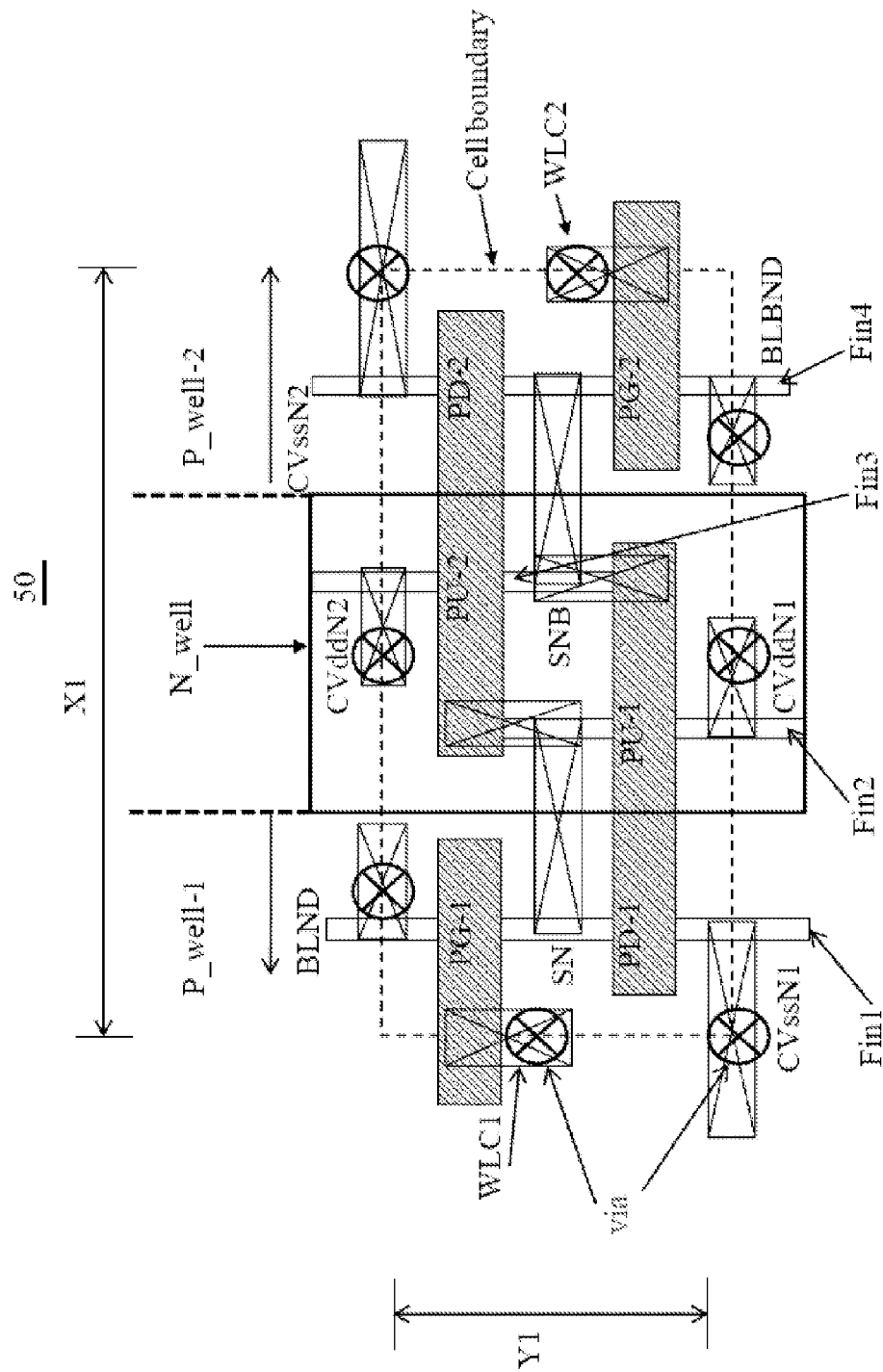
FIG. 5 depicts in a plan view a layout of an embodiment SRAM cell.

FIG. 5 depicts in a plan view the layout of a first example embodiment SRAM cell 50 of the single fin type. In FIG. 5, the local interconnects, fins, and wells are shown for a 6T SRAM cell using single fin finFET devices. The transistors are labeled as for FIG. 1 above, for example, PG-1, PU-2 etc. Fins are numbered Fin1, Fin2, Fin3, and Fin4 and are each a semiconductor fin. Fin1 and Fin4 are formed over P_well-1 and P_well-2. Fins 2 and 3 are formed over an N_well region to provide the semiconductor region for the p-type transistors PU-1, PU-2. The N_well region also provides a contact for the body or bulk terminal of the p-type transistors and in embodiments of the SRAM cells, may be coupled to different positive voltages to further enhance performance. The fins provide the channel, source and drain regions for n-type devices such as PD-1, and PG-1, for Fin1, and PD-2, PG-2, for Fin4. The gate material is shown for each transistor and where the gate overlies a fin, a transistor is formed. Thus in this orientation, which is for illustration and arbitrarily selected, PD-1 is formed over the lower portion of Fin1, and PG-2 is formed over the lower portion of Fin4.

The fins are also a connection point for upper level metal patterning (not shown in FIG. 5) to connect the SRAM cells to the bit lines, word lines, and cell power supplies CVdd and CVss. For example, the word line contacts WLC1 and WLC2 are labeled in the figure. The contacts, depicted as rectangular material with an X pattern, will extend vertically as metal or other conductor materials in an opening formed in a dielectric layer, and will provide a vertical connection to the overlying metal conductors. The contacts also provide local interconnection between elements, for example the lower portion of Fin3 is coupled to the lower portion of Fin4. Where needed, vias are also shown, depicted as circular shapes with an X in the center, and the vias vertical provide connections between different metal layers, such as between metal-1 and metal-2. So the word line contact WLC1 is shown with an overlying via. Contacts also provide local interconnections, such as the contacts at the storage node SN, which couple the gate of PU-2, PD-2 and the respective source/drain terminals of transistor PU-1 (Fin2) and PD-1 (Fin1) together. Fin1 couples the bit line node BLND to one source/drain of the pass gate transistor PG-1, the storage node SN is coupled to the other source/drain terminal, and so the voltage on a word line at WLC1 can couple these nodes together by turning on the pass gate transistor PG-1. Similarly, Fin4 provides the bit line bar node BLBND at one source/drain terminal of the pass gate transistor PG-2, and the word line contact WLC2 and its via provide connection to the word line, so that the word line voltage can turn on PG-2 to couple the BLBND to storage node SNB.

The SRAM cell 50 has a central N-well portion over which the fins Fin2 and Fin3 are formed. The Fin2 provides node CVddN1, as in FIG. 1, coupled to one terminal of the pull up transistor PU-1 by a contact and via. Fin2 also provides the storage node SN coupled to the other terminal of PU-1. Fin3 provides the node CVddN2 coupled to one terminal of the pull up transistor PU-2 such as shown in FIG. 1, and the other source/drain terminal is coupled to SNB, as in FIG. 1. Both PU2-1 and PU-2 are typically p-type transistors as shown in FIG. 1. The N_well may be connected to a voltage terminal to provide the bulk or body connection to the transistors formed on Fin2, and Fin3. For example, the N_well may be connected to a periphery Vdd power line, importantly this voltage is electrically isolated from the cell positive supply voltage CVdd. In other embodiments, the N_well may be coupled to the cell supply voltage CVdd.

The cell 50 has a pitch in the vertical or Y direction of Y1 and pitch in the horizontal or X direction of X1. The actual dimensions of these pitches are determined by the design rules and scale of the semiconductor process being used. In certain embodiments, the ratio of X1 to Y1 may be greater than or equal to 2. As will be described below, the second type of cell that is used in combination with the single fin embodiments of FIG. 5 has a larger X pitch, that is, an X direction pitch that is greater than X1 by at least about 1.1.

Figure 6:
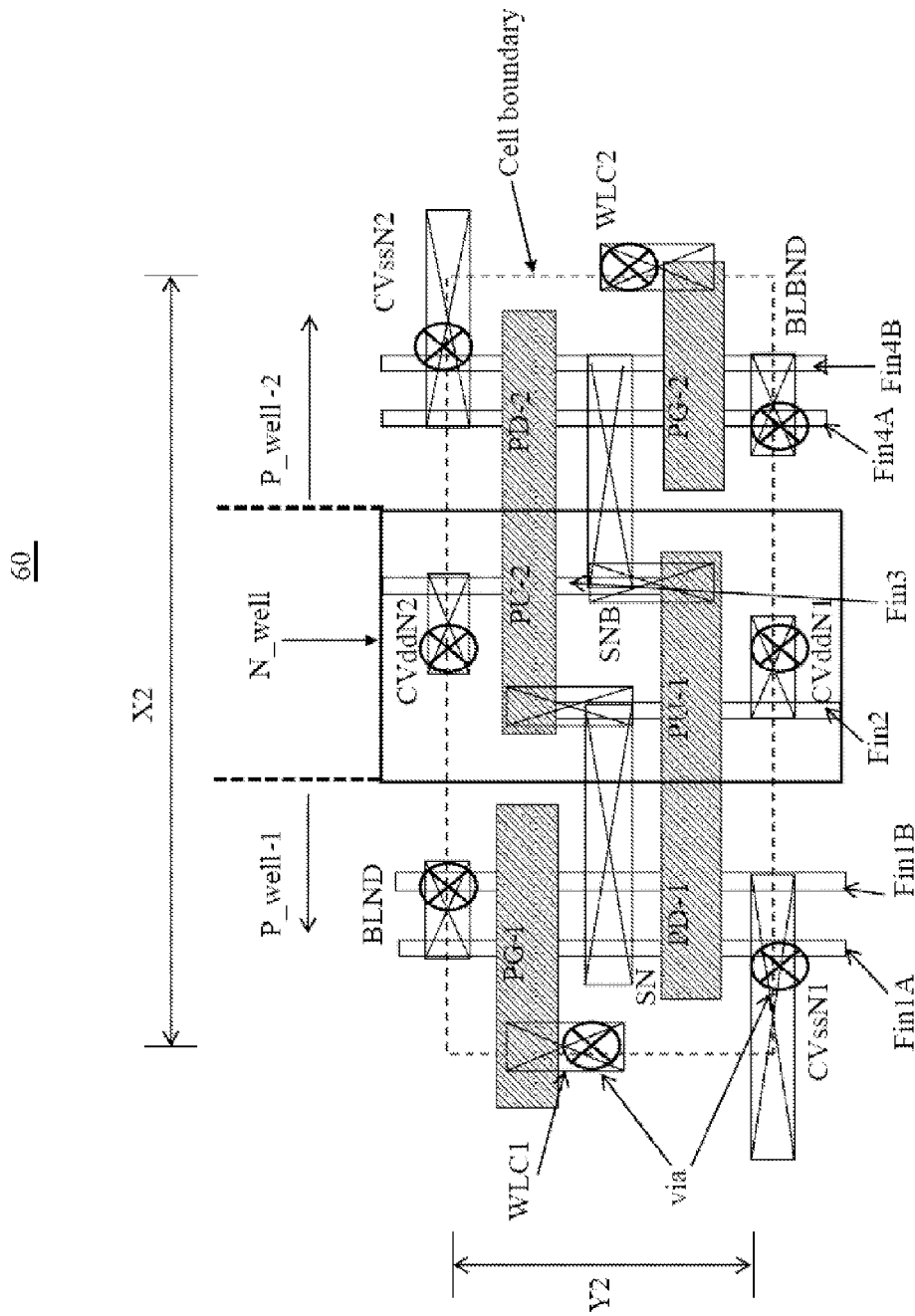
FIG. 6 depicts in a plan view a layout of an alternative embodiment SRAM cell.

FIG. 6 depicts in a plan view an example embodiment of the second type SRAM cell 60, a multiple fin finFET SRAM cell for a 6T cell. In FIG. 6, the circuit function is the same as for the circuit in FIG. 1. The pass gate transistors PG-1 and PG-2 again couple bit line nodes BLND and BLBND to the storage nodes SN and SNB, respectively. The pull up transistors PU-1 and PU-2 are formed in the N_well and couple the cell positive power supply CVdd at nodes CVddN1 and CVddN2 to the nodes SN and SNB. Transistor PU-1 is formed on Fin2 and PU-2 is formed on Fin3, as in FIG. 5.

In this embodiment, the fin for pull down transistor PD-1 and pass gate transistor PG-1 has been doubled using fins Fin1A and Fin1B that are coupled in parallel. That is, the gate for PG-1 extends over both fins Fin1A and Fin1B. The contact at the node BLND couples the fins together at one source/drain terminal of transistor PG-1. The contact at the storage node SN similarly couples the remaining source/drain terminals of the transistor PG-1 together, so that the two fins Fin1A and Fin1B form a single, larger drive transistor for the pass gate PG-1. Similarly the source and drain terminals for transistor PD-1 are formed on fins Fin1A and Fin1B, and the gate extends over both fins Fin1A and Fin1B. In this embodiment, two fins are used for each of the N-type transistors PG-1, PD-1, also PG-2 and PD2. PG-2 and PD-2 are formed over fins Fin4A and Fin4B, both in P_well-2. The word lines (not shown) will contact the gate of PG-1 at word line contact WLC1, and this pass gate couples the bit line node BLND to the storage node SN responsive to a voltage on the word line. Similarly the word line contact WLC2 provides a connection to the gate of pass gate PG-2, which couples the bit line bar node BLBND to the storage node SNB. Note the horizontal contact for storage node SN is now wider to cover both fins Fin1A and Fin1B, similarly the horizontal contact for SNB extends over both fins Fin4A and Fin4B.

In operation, the two embodiments, the single finFET cell of FIG. 5, and the multiple finFET cell of FIG. 6, each operate in the same manner. However because the n-type transistors of the multiple fin finFET embodiment of FIG. 6 have added drive strength, the power connections to those cells can be simplified as will be further described below. The multiple fin embodiment of FIG. 6 has different pitch distances Y2 and X2, as shown in FIG. 6. The ratio of X2 to Y2 may be, for example, greater than or equal to 3. Using the multiple fins in FIG. 6 does increase the X pitch over the single fin arrangement of FIG. 5. X2 may be, for example, greater than X1 and at least 1.1 times X1 for a given set of design rules for a semiconductor process. However the Y pitch is not increased and Y1 may be substantially equal to Y2; although in alternative embodiments, the pitches may differ. If further drive strength is required, the number of fins for Fin1 and Fin4 may be extended to three, four or more fins. In these alternative embodiments, the X pitch X2 may increase further still. In these embodiments, the contacts will further extend to correspond to the added pitch between the fins and couple the source and drain portions together to form a multiple fin finFET transistor.

Figure 7:
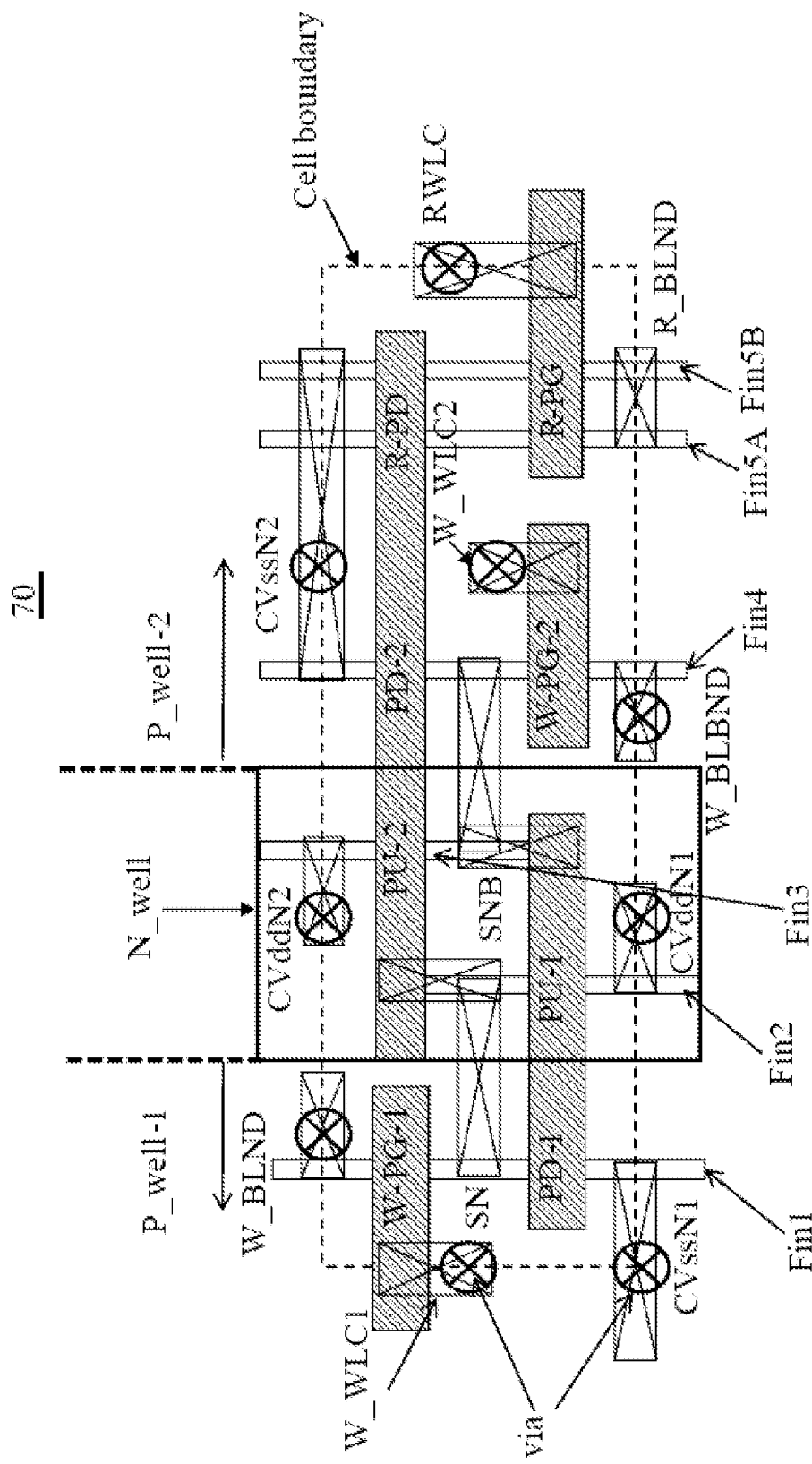
FIG. 7 depicts in another plan view a layout of another alternative embodiment SRAM cell.

FIG. 7 depicts in a plan view the layout for an embodiment SRAM cell 70 that implements the two port SRAM circuit of FIG. 2. In FIG. 7, single fin transistors are used to form the transistors of the 6T SRAM cell, including the write pass gates W_PG-1, W_PG-2, and the pull up and pull down transistors PU-1, PD-1, PU-2, PD-2. The write word line connections are provided at the contacts W_WLC1 and W_WLC2, and the associated vias. The fins Fin1, Fin2, Fin3 and Fin4 each provide the source, drain and channel regions for finFET transistors with the labeled transistor gates overlying the fins. During write operations, the write word line will be connected to the gates of the transistors W-PG-1 and W-PG-2 and a high voltage on the word line will cause the transistors to couple the voltages on the bit lines at bit line nodes W_BLND and W_BLBND to the cell storage nodes SN and SNB, respectively.

As in the circuit schematic of FIG. 2, the SRAM cell 70 has a dedicated read bit line and a pair of read transistors coupled in series cascade fashion. The pass gate R-PG has a gate coupled to the read word line contact RWLC. In a read operation, when the read word line is active, the pass gate R-PG couples the read bit line at node RBLND to the pull down transistor R-PD. Note that the cell storage node SN is isolated from the read bit line R_BLND by the read port transistors, so that the cell pull down transistors PD-1, PD-2 do not have to discharge the capacitive load of the bit line at node RBLND, thus the dual port SRAM cell may operate at a reduced voltage CVdd and without the use of the increased drive strength transistors used in FIG. 6 embodiments, for example. The cost for this bit line-cell isolation is the area used by the dedicated read bit line and the added transistors R_PG and R_PD. When the stored bit at node SN is a "1" or high voltage, the pull down transistor R_PD couples the read bit line node R_BLND to the ground or Vss supply at CVssN2.

Because the read port transistors will discharge the read bit line, these transistors are implemented in this example embodiment using multiple fin finFETs formed on double fins, labeled Fin5A and Fin5B. The use of the multiple fins increases the channel width and the drive strength of the read port transistors. Additional fins may be used to add further drive strength, and these modified arrangements provide additional alternative embodiments.

In the embodiments of FIGS. 5, 6, 7, the fins are shown having a common width. However, it is possible that some of the fins have different widths than others, for example the fins in the N_well regions could be wider than those in P_well regions. These modifications would provide additional alternative embodiments for each of the cells depicted above.

Figure 8:
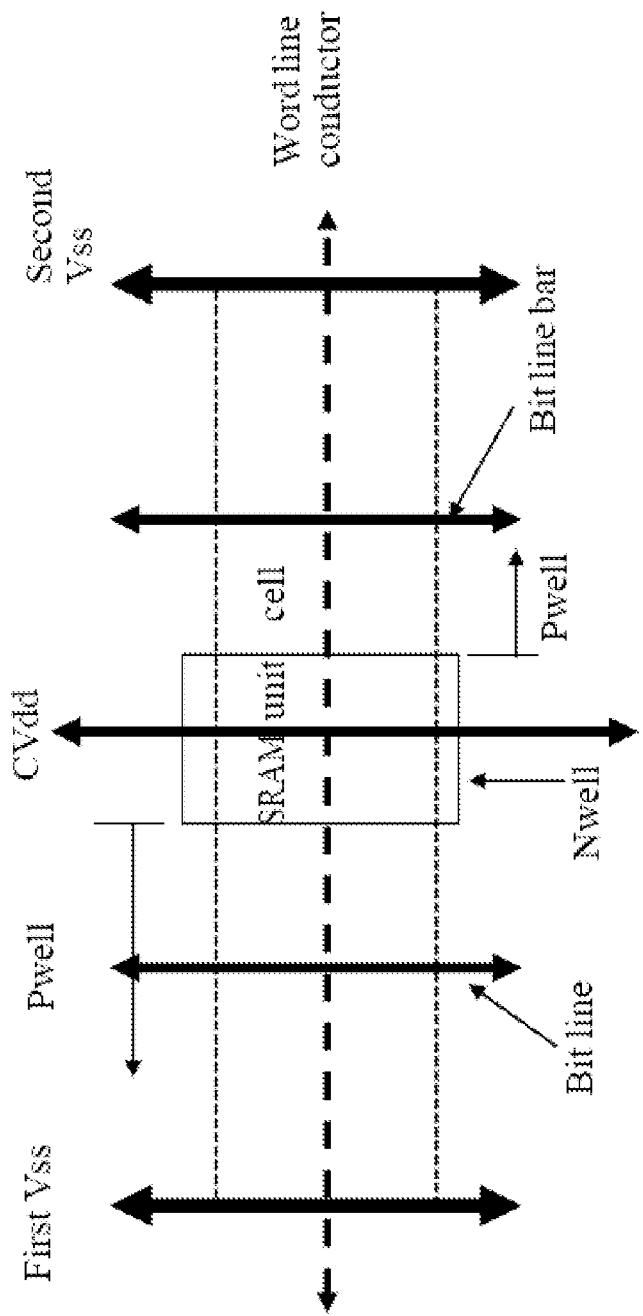
FIG. 8 depicts in a top view a metallization pattern for use in an SRAM array embodiment.

For clarity of illustration, the layout views of FIGS. 5, 6 and 7 depicting the various embodiments show the local interconnect, contacts, via and gate connections, but omit the metal layers. FIG. 8 depicts in a simple plan view one embodiment of the overlying metal pattern for the SRAM cells. In FIG. 8, the word line conductor, which may be a metal-1 or metal-2 conductor, is shown running across the middle of the cell in the X direction. Looking at the vias for the word line contacts in FIGS. 5, 6 and 7, it may be observed that the word line connections are generally arranged along a central portion of the cells from left to right. The bit line and bit line bar connections are arranged in parallel on opposite sides of the N-well and running in the Y direction. The cell positive power supply CVdd is arranged in the Y direction running centrally over the N-well. Again examining the layout views of FIGS. 5 and 6, for example, it can be observed that the nodes CVddN1 and CVddN2 and the associated vias are arranged in alignment for the vertical connections.

In the embodiment of FIG. 8, the first and second Vss lines are also shown arranged vertically, outside of the N_well and on opposite sides, and outside of the bit line pair. The nodes CVssN1 and CVssN2 in FIGS. 5, and 6, for example, illustrate where the contacts and vias for these connections are formed in each cell layout. The bit lines, CVdd, and first and second CVss lines are arranged in columns in the embodiment of FIG. 8. These conductors may be formed in metal 1, metal 2 or other metal layers, so long as they are electrically isolated from one another and from the word line conductor. Note that for the dual port embodiment SRAM cells, such as the layout shown in FIG. 7, an additional read word line conductor, and an additional read bit line conductor, would be added. The additional read word line conductor may be formed in parallel to the word line conductor shown in FIG. 8; similarly the added read bit line conductor may be formed in parallel to and proximal to the bit line bar conductor of FIG. 8; as indicated by the contacts shown in FIG. 7.

Figure 9:
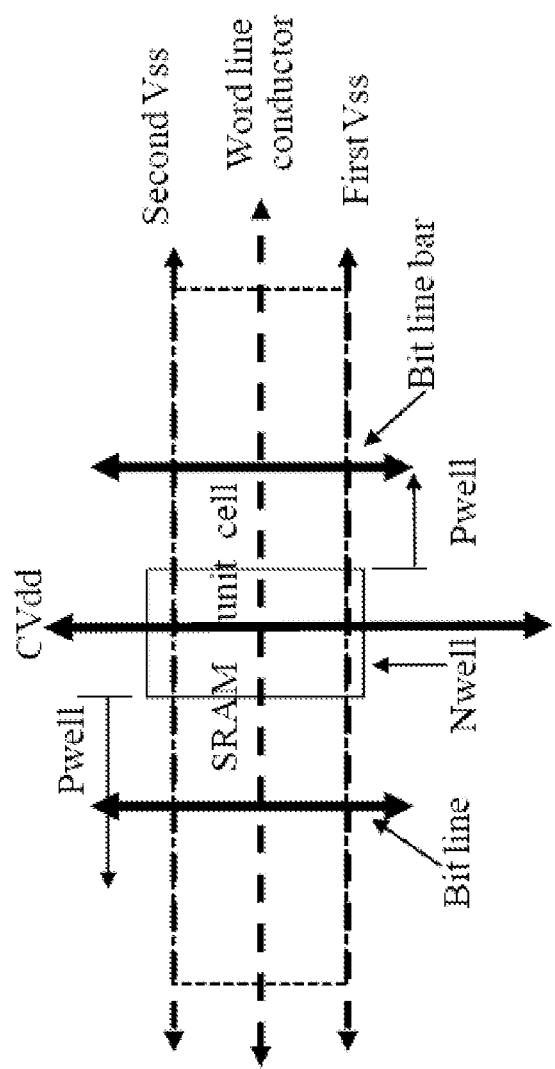
FIG. 9 depicts in a top view an alternative metallization pattern for use in an SRAM array embodiment.

FIG. 9 depicts in a plan view an alternative metal pattern that may be used to couple the SRAM cells of FIGS. 5, 6 and 7 to the respective metal layer conductors. In FIG. 9, the word line conductors and the first and second Vss conductors are formed along the X direction or in rows; while the Vdd conductor CVdd and the bit line pair run in the Y direction and in parallel, or in columns. Again examining the contacts and vias shown in FIGS. 5 and 6, the alignment of the cell nodes to the conductors can be easily observed.

The operation of the single fin finFET SRAM cell and the multiple fin finFET SRAM cell embodiments are somewhat different, and in arrays using the cells, a voltage control or "assist" circuit may be used to provide different voltages on the cell positive voltage supply CVdd for different operations. For the single fin finFET SRAM cells, a lowered CVdd voltage is used in the write cycle, while a voltage equal to or greater than the voltage on the word line is used in the read cycles. For the multiple fin SRAM cells, the read and write operations do not require any different CVdd voltage, although in some embodiments, a voltage control circuit may be used to provide a lowered CVdd for standby mode, in all types of cells.

Table 1 depicts, for each embodiment SRAM cell, several characteristics presented in comparison to the other type of cell.

TABLE 1

| Characteristic | First type- smaller SRAM cell | Second type - faster SRAM cell |
|---|---|---|
| Cell type | Single fin finFET for all transistors | Multiple fin finFET for pull down and pass gate transistors |
| Assist circuitry | Write or read assist, and/or standby mode | Standby mode, or, no assist needed |
| Write cycle | CVdd < V_WL | CVdd ≈ V_WL |
| Read Cycle | CVdd ≈ V_WL or CVdd > V_WL | CVdd ≈ V_WL |
| Standby Cycle | CVdd reduced 200-600 millivolts | CVdd reduced 200-600 millivolts, or not reduced |
| N Well connection | Isolated from CVdd, connected to Vdd periphery | Either connected to CVdd or to Vdd periphery |

Figure 10:
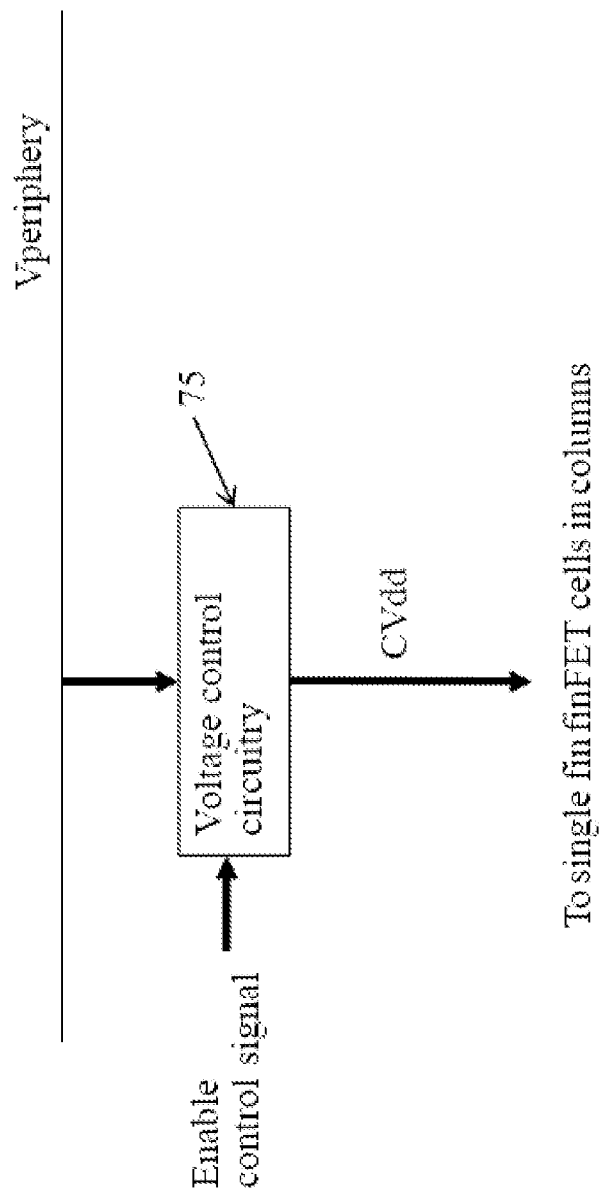
FIG. 10 depicts in a block diagram a voltage control circuit for use with the embodiments.

As shown in Table 1, the first type SRAM cells require additional circuitry to provide the different voltages needed on the CVdd lines for certain operations. In some embodiments, a standby assist circuit may also be used with the second type SRAM cells. FIG. 10 depicts a column voltage control circuit 75; which may be provided for each column in an example SRAM array as further described below. The enable control signal may cause the voltage control circuit 75 to output a voltage CVdd that is less than a voltage placed on the word lines V_WL during a write operation, as indicated in Table 1. Further, in other embodiments, the circuitry may also output a boosted or elevated voltage on CVdd during a read operation; alternatively the voltage CVdd may be approximately equal to the word line voltage in a read operation, also indicated in Table 1. Finally when the SRAM array is in a "standby" mode, the cell positive supply voltage CVdd may be substantially reduced from a nominal level by as much as 600 millivolts, also as indicated in Table 1. This feature is especially significant when a system or integrated circuit containing the SRAM array is used in a battery powered device such as a cellphone, tablet, laptop, PDA, book reader, music or video player or the like. Note that a voltage control circuit may also be used with an array of the second type multiple fin finFET SRAM cells in the standby mode to reduce power.

As shown in Table 1 for the faster or second type SRAM cells, the multiple fin finFET SRAM cells of the embodiments, the voltage supply levels for reading and writing are simpler than for the single fin finFET cell embodiments. Generally, the cell supply voltage CVdd is approximately equal to the active high voltage on the word lines V_WL for read and write cycles for these cells. The added drive strength in the pass gate and pull down finFET devices in these larger SRAM cells reduces the need to increase the cell voltage during reads, for example. The pull down transistors in the multiple fin cells have added drive current to pull down the bit lines; or to allow for a decreased cell supply voltage during writes. The pass gate transistors in these cells are also multiple fin devices and also have added drive current to overcome the prior stored data on the storage nodes during a data write. In standby mode, the multiple fin finFET cells may also have their cell Vdd supply voltage reduced to save power. This is also shown in Table 1. Alternatively, the cell positive voltage supply CVdd of the multiple fin finFET cells may be coupled directly to the peripheral voltage Vdd, and in that arrangement, no voltage control circuitry is then required for these SRAM cells.

Figure 11:
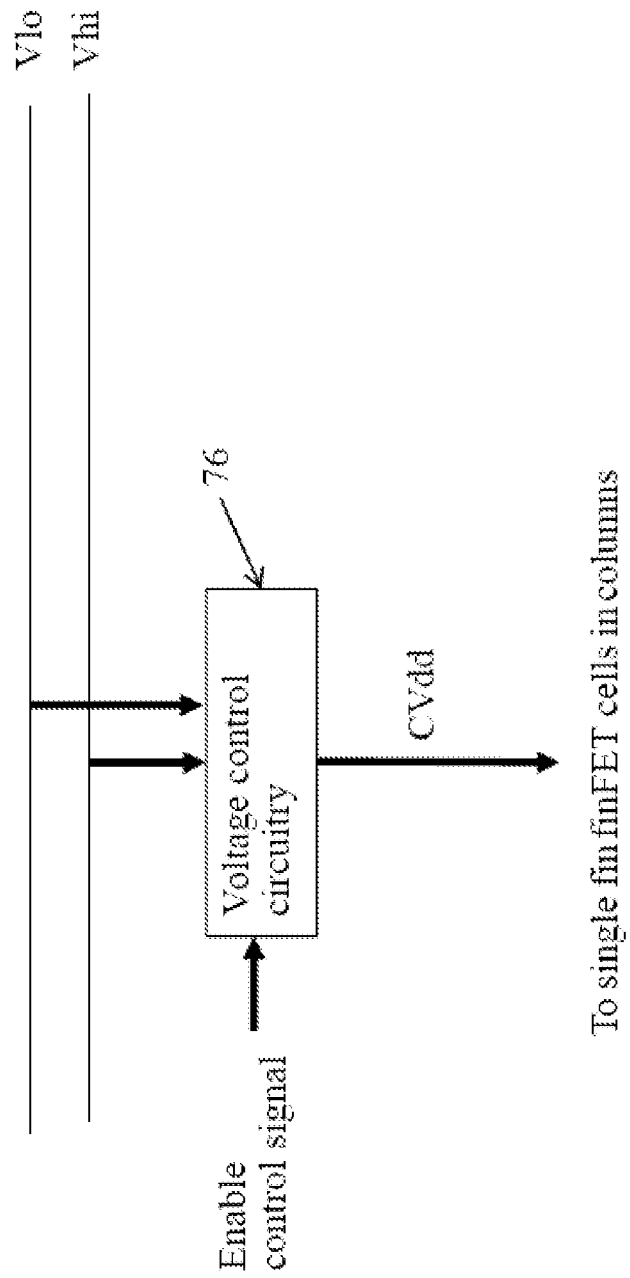
FIG. 11 depicts in a block diagram an alternative embodiment voltage control circuit.

FIG. 11 depicts a simple circuit diagram of an alternative voltage control circuit 76. In FIG. 11, instead of the voltage control circuit creating a reduced voltage for writes and an increased voltage for reads, the input Vdd voltages include a "hi" and "lo" voltage. The voltage control circuit 76 then selects between them, based on control input signals, and outputs a selected voltage to the CVdd of the cells. Again, as indicated in Table 1, the cell positive voltage CVdd may be reduced during writes and standby operations, and increased during reads, to enhance the access times of the single fin embodiment SRAM cells. For the second type SRAM cells with multiple fin finFETs, only the standby mode may use a reduced CVdd.

Figure 12:
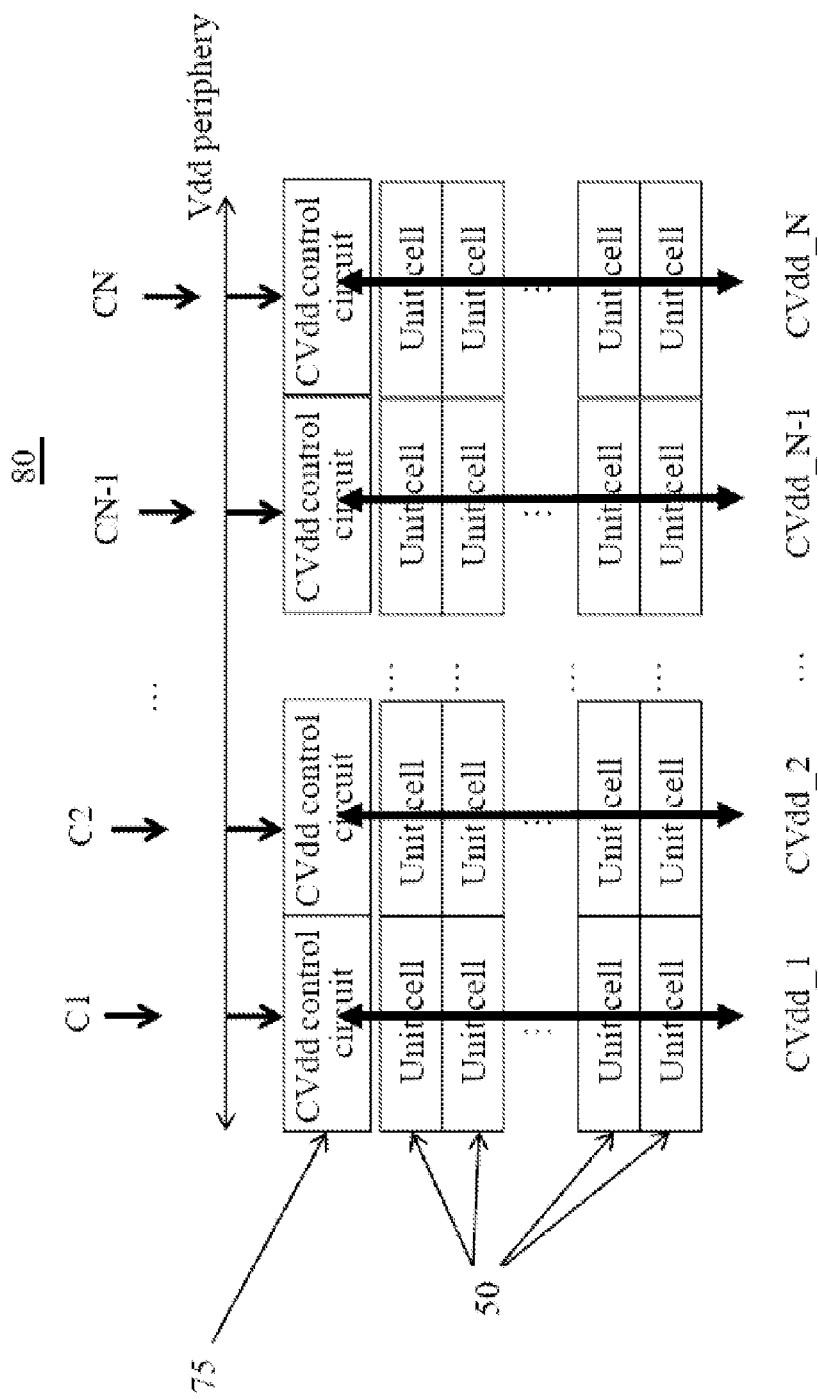
FIG. 12 depicts in a block diagram an SRAM array embodiment.

FIG. 12 depicts an embodiment SRAM array 80 using the finFET cells 50 of FIG. 5, for example, to form the array. The finFET cells 60 of FIG. 6 may also be used. The SRAM cells 50 are arranged in columns labeled C1-CN. Each column of cells has a cell Vdd line labeled CVDD_1-CVdd_N. The unit cells are arranged in rows and word lines (not shown for clarity) will run along each row of cells. In a given cycle, for example a read cycle, a row of cells may be selected by a voltage on the word line, and the stored data will be output on bit line pairs (also not shown in this figure) for each column.

Each column of cells C1-Cn has a CVdd control circuit 75. The input in this example embodiment is a single Vdd voltage, such as Vdd periphery. Alternatively, the voltage control circuits could be those depicted in FIG. 11, for example, and receive a high and low voltage input.

Figure 13:
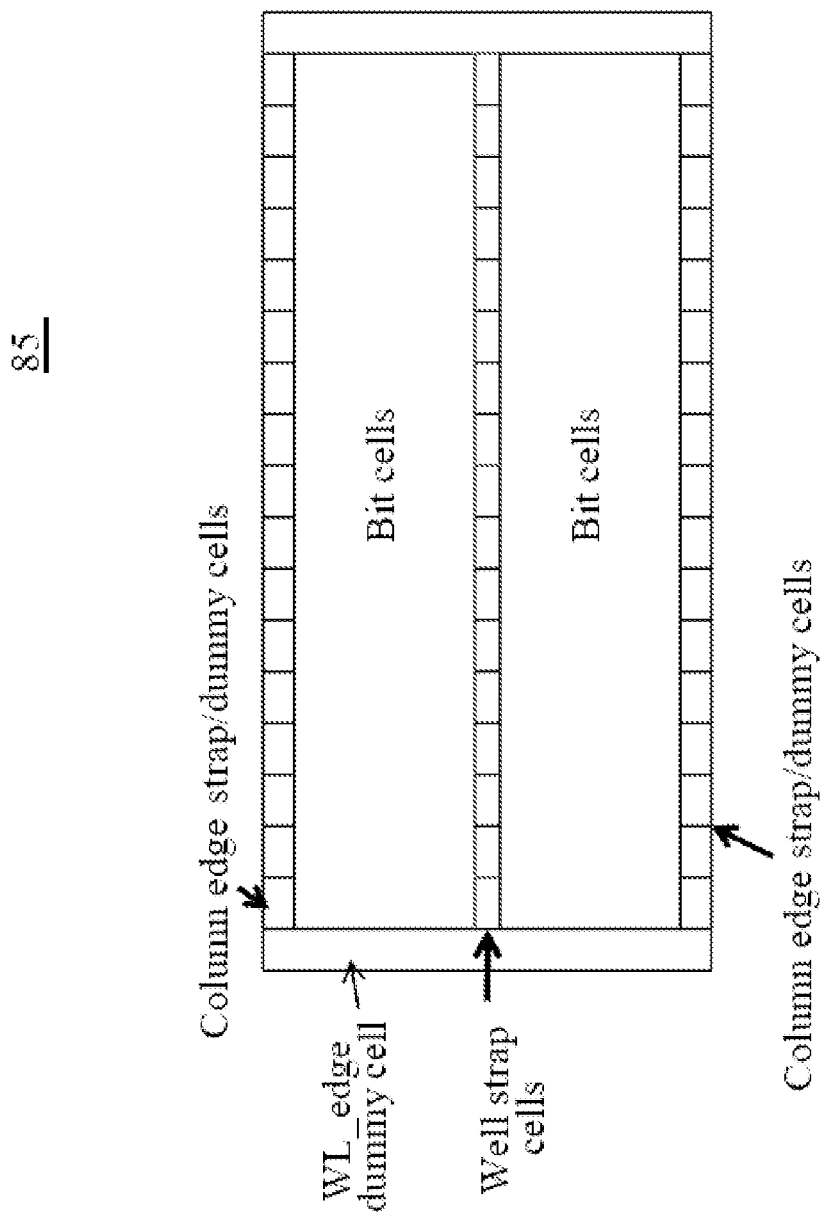
FIG. 13 depicts in a plan view cell layout for an SRAM array embodiment.

FIG. 13 depicts in another plan view the layout for an SRAM array 85 using the SRAM cells of the embodiments. In FIG. 13, the SRAM array includes a row of cells labeled "Well strap cells". These cells do not store data but instead provide connections between the N and P wells to supply the bulk terminal voltages as needed. Similarly, the edges of the SRAM array 85 include column edge strap/dummy cells, which provide connections to the voltage supplies Vdd and Vss. Also as shown the array includes WL_edge dummy cells, which provide connections to the word lines and may include driver circuitry for the word lines.

Figure 14:
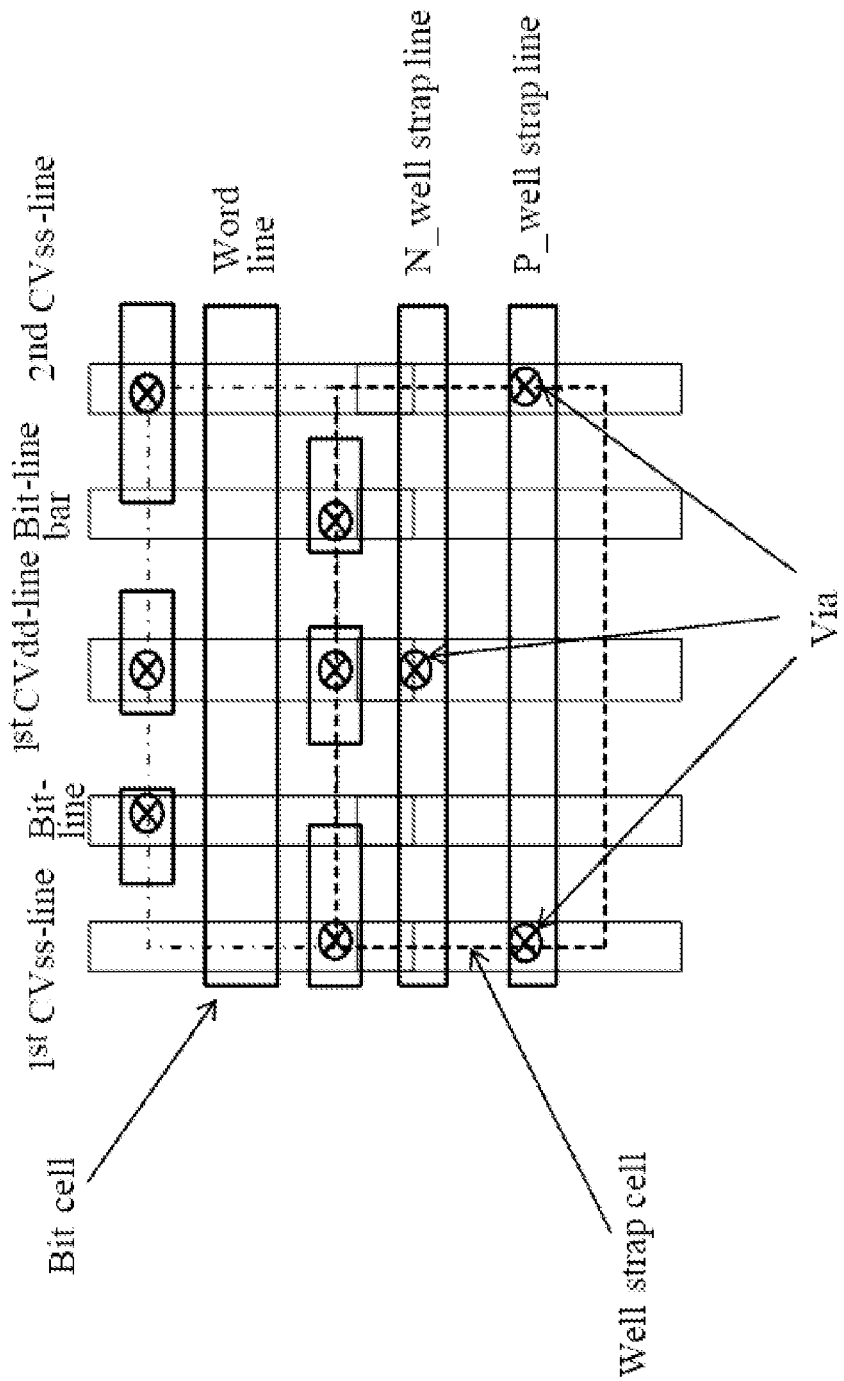
FIG. 14 depicts in a plan view the layout for the well strap cells of FIG. 13.

FIG. 14 illustrates in a plan view the layout of a single well strap cell as used in the array 85 in FIG. 13. In FIG. 14, a bit cell is shown above the well strap cell. The bit cell may be, for example, the single fin embodiment SRAM cell of FIG. 5. In the column conductors, which may for example a metal layer such as metal-2, there is on the left side a first CVss line, then the bit line, the CVdd line running through the central portion of the bit cell, the bit line bar line, and then the second CVss line. In the rows the word line is running horizontally across the bit cell, the word line may be a metal-1 conductor, for example, separated by interlevel dielectric from the column conductors. Other metal levels could also be used. In the well strap cell, vias are depicted coupling the N well strap line, for example, to the CVdd line. In the array, the N wells using the arrangement of FIG. 14 may have a well metal connection to CVdd. From Table 1 this can be seen as applicable to cells without the voltage assist circuitry, that is, cells with multiple fin finFETs. The P well strap line also runs horizontally and is coupled to Vss using two vias, one for the first CVss line, and one for the second CVss line.

For the single fin finFET SRAM cell embodiments, as indicated in Table 1 the N wells are to be isolated from CVdd and so the vias of FIG. 14 would not couple the N well to CVdd for those embodiment cells. Instead the N well straps for those cells are to be tied to Vdd from the periphery or another source and be electrically isolated from CVdd.

Figure 15:
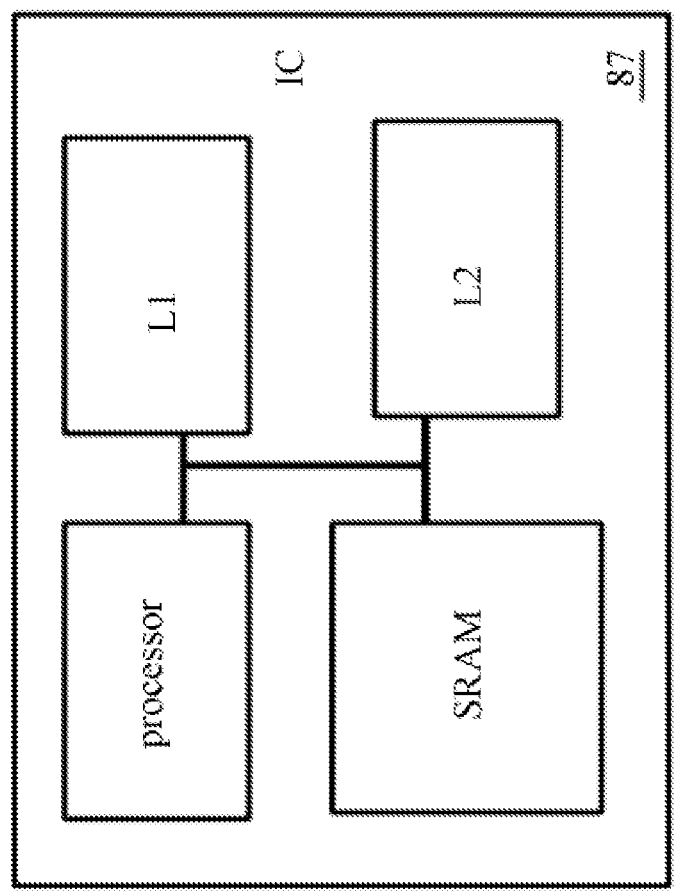
FIG. 15 depicts in a block diagram an integrated circuit embodiment.

FIG. 15 depicts in a block diagram an embodiment integrated circuit with a core processor coupled to three SRAM arrays configured as a level 1 cache L1, a level 2 cache L2, and a general use memory labeled SRAM. The core processor could be a microprocessor, a reduced instruction set computer (RISC) core, a licensed core such as an ARM core, a digital signal processor ("DSP") or the like. The single fin finFET SRAM cells of FIG. 5, for example, may be used to form the memory SRAM on the integrated circuit 87. For this type of SRAM array, the density (data bits per area) is of prime importance. For the caches L1 and L2, the multiple fin finFET cells of FIG. 6, for example, may be used. For cache SRAM arrays, data access speed may be more important than the area used per bit. Alternatively, the dual port SRAM cells of FIG. 7 could be used for the L1 or L2 cache arrays on the integrated circuit 87.

Figure 16:
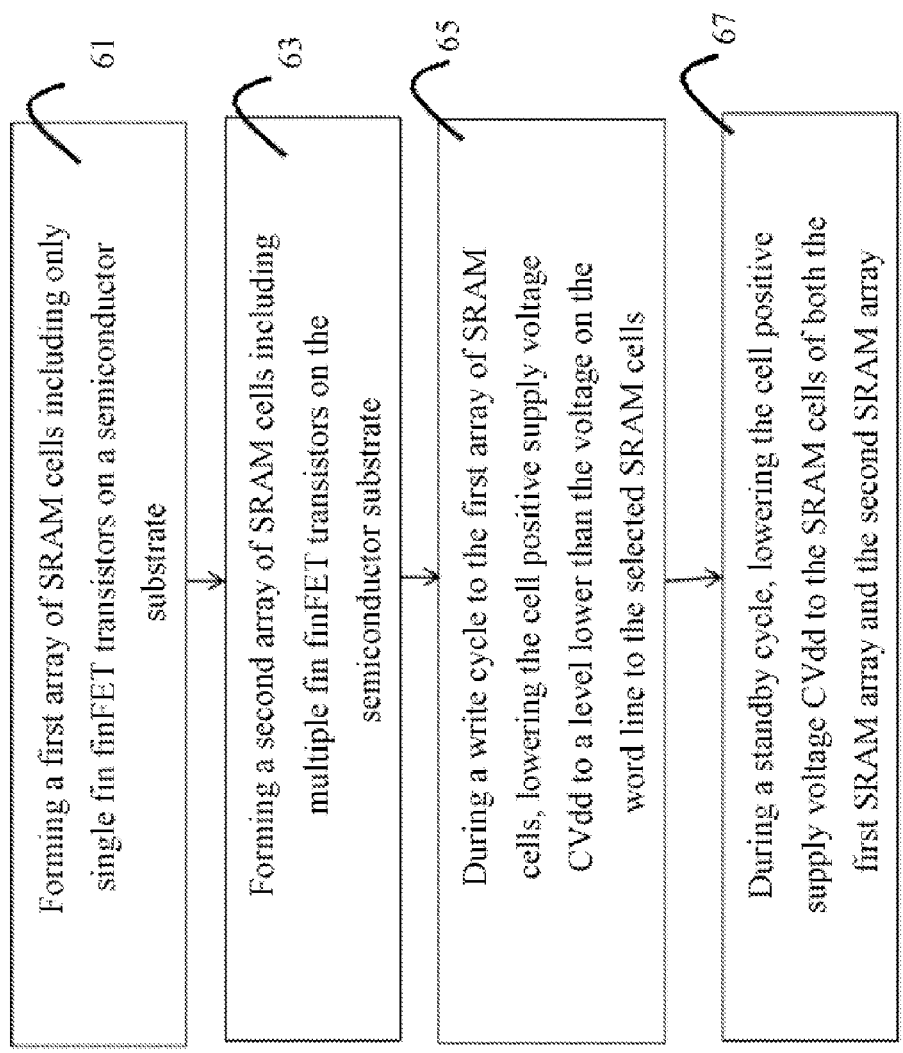
FIG. 16 depicts in a flow diagram a method embodiment.

FIG. 16 depicts in an example method embodiment a flow diagram. In step 61, a first array of SRAM cells of single fin finFET transistors is formed on a semiconductor substrate. In step 63, a second array of SRAM cells including multiple fin finFET transistors is formed on the semiconductor substrate. In step 65, during a write cycle to the first array of SRAM cells, lowering the cell positive supply voltage CVdd to a level lower than the voltage on the word lines of the selected cells; and in step 67, lowering the cell positive supply voltage CVdd to the SRAM cells in the first array and the second array of SRAM cells in a standby cycle. By varying the cell supply voltage to the smaller SRAM cells having only single fin finFET transistors, the write margins and read access times may be improved; while for the larger area SRAM cells having multiple fin finFET transistors on the same device, varying the cell positive supply voltage CVdd is not necessary.

Use of the embodiments of the present application make providing both high density and high speed SRAM arrays on a single integrated circuit in a single manufacturing process straightforward, and this capability is provided without additional manufacturing steps, complex implant and Vt adjusts, or design of varying gate lengths for certain devices in the SRAM cells.

In an example embodiment, an integrated circuit includes at least two SRAM arrays of different cells. A first single port SRAM array of 6T SRAM cells is formed of single finFET transistors for each of the transistors of the cross-coupled inverters of the SRAM cells and for each of the two pass gates for each of the SRAM cells. Each of the SRAM cells is coupled to a cell positive voltage supply CVdd, a cell negative power supply CVss, and to a pair of bit lines and a word line for selecting the SRAM cells. The CVdd line for each of the cells is coupled to a first voltage control circuit. A second SRAM array on the integrated circuit is a single port SRAM array of a second type of 6T cells; each formed of cross coupled inverters, each of the inverters including a single finFET p-type pull up transistor and a multiple fin finFET n-type pull down transistor. Each of the second type SRAM cells also includes two pass gates coupled to true and complementary bit lines, the two pass gates each formed by multiple fin finFET transistors, and each of the SRAM cells of the second array being coupled to a second voltage control circuit. The SRAM cells of the first array have a pitch in an X direction of X1, and a pitch in a Y direction of Y1; while the SRAM cells of the second array have a pitch in the X direction of X2, and a pitch in the Y direction of Y2; a ratio of X1 to Y1 is greater than or equal to about 2, and a ratio of the X2 to Y2 is greater than or equal to about 3, while a ratio of X2 to X1 is greater than about 1.1.

In further embodiments, the first voltage control circuitry is write assist circuitry that is coupled to the SRAM cells of the first SRAM array, and which further receives an input from a Vdd periphery supply line, and which has an output connected to the cell supply voltage CVdd. The first voltage control circuitry has an enable input that has a first state for a write cycle and a second state for a read cycle. In a write cycle the output on the cell supply voltage CVdd is lower than the input voltage. In a read cycle the output on the cell supply voltage CVdd is higher than, or equal to, the input voltage.

In additional embodiments, in the integrated circuit having the two SRAM arrays, the second voltage control circuit is a standby mode circuit and has a voltage input, an enable input, and outputs a voltage on the cell supply voltage CVdd for the SRAM cells. The voltage input may be coupled to a supply voltage such as a periphery Vdd power voltage. The enable input has two states, one for a read or write cycle, and a second for a stand by cycle. During a read or write cycle, the voltage output is substantially equal to the input voltage. In a standby cycle, the voltage output is lower than the input voltage. In additional embodiments, the lowered output voltage may be between about 100 millivolts and 600 millivolts lower than the input voltage to the second voltage control circuitry.

In further embodiments, the SRAM arrays in the integrated circuit may have word lines that are placed at a voltage equal to the periphery Vdd voltage level or the Vss or ground voltage level. During a write cycle, the word lines may be at the level of the periphery Vdd voltage while the SRAM cells in the first array may have a supply voltage CVdd that is less than the word line voltage. In additional embodiments, the voltage CVdd may be lower than the word line voltage by from 50 millivolts to about 400 millivolts.

In additional embodiments, the p-type pull up transistors of the SRAM cells in both the first and second arrays may have source, drain, gate and bulk terminals. The bulk terminals are formed by an N-type lightly doped N-well. In the first SRAM array of the integrated circuit, the N-wells may be contacted in N-well strap cells. The N-well strap cells are placed in the center of the array or alternatively at the array edges and have a well metal line running through the N-well strap cells. The well metal line may be connected to a positive supply voltage that is electrically isolated from the cell supply voltage CVdd, such as Vdd periphery. In a further embodiment, the well metal lines of the first SRAM array may be isolated from the cell supply voltage CVdd, while the well metal lines of the second SRAM array are coupled to the cell supply voltage CVdd.

In yet another embodiment, the first voltage control circuitry may be read assist circuitry. The read assist circuitry may have an input coupled to a predetermined positive power supply voltage. The output is connected to the cell positive power supply CVdd. The first voltage control circuitry has an enable input that has two states, one for write cycles, and another for read cycles. The output in the read cycle is substantially equal to, or higher than, the input voltage. In a further embodiment, during a read cycle, the output of the first voltage control circuitry may be between 30 millivolts and 200 millivolts greater than the voltage on the word lines during the write cycle.

In further embodiments, the SRAM cells of both the first and second SRAM arrays are arranged in rows and columns. The word lines run parallel to and along the rows, while the bit line pairs run parallel to and along the columns. The SRAM cells are arranged between, and coupled to, the true and complementary bit lines. A first voltage control circuit is provided for each column of cells and provides the CVdd supply for the column of cells. In addition cell negative supply voltage lines CVss run along the columns of cells and are coupled to the pull down transistors in the column of cells.

In yet another embodiment, the SRAM cells of the first SRAM array have a pitch in a Y direction of Y1, and the SRAM cells of the second SRAM array have a pitch in the Y direction of Y2, and pitches Y1 and Y2 are approximately equal.

In yet another embodiment, an integrated circuit includes two single port SRAM arrays; the first SRAM array of first size cells and the second SRAM array of second size cells. The first SRAM array is formed of 6T SRAM cells including a pair of cross coupled inverters storing data on a storage node and on a complementary storage node, and having pass gates coupled between a bit line and a complementary bit line and coupled to the storage node and complimentary storage node. The first array of SRAM cells are each coupled to a voltage control circuit which supplies the cells the cell positive supply voltage CVdd. Each of the transistors in the 6T SRAM cells in the first array is a single fin finFET transistor. The second array of SRAM cells is formed of 6T SRAM cells including a pair of cross coupled inverters each having a single fin finFET pull up transistor and a multiple fin finFET pull down transistor, and each SRAM cell further including two pass gates coupled between a storage node and a complementary storage node and a bit line and a complementary bit line, the two pass gates each formed of a multiple fin finFET; and each of the 6T SRAM cells in the second array having a cell positive supply CVdd that is coupled directly to a predetermined VDD supply voltage. The SRAM cells of the integrated circuit each have an X direction pitch and a Y direction pitch, the cells in the first SRAM array have an X pitch of X1 and a Y pitch of Y1 and X1 is equal to or greater than about twice Y1; the SRAM cells in the second SRAM array have an X pitch X2 and a Y pith Y2 and X1 is equal to or greater than about three times Y2, and the ratio of X2 to X1 is equal to or greater than about 1.1.

In a further embodiment, the voltage control circuitry in the first SRAM array is write assist circuitry. The voltage control circuitry has an input voltage, an output coupled to the cell positive supply voltage CVdd, and an enable input signal. In an embodiment the input node is connected to a Vdd periphery power supply. The enable input signal as one state for a write cycle and another state for a read cycle. During the write cycle, the voltage control circuitry outputs a lower voltage on the cell supply voltage CVdd than the input voltage. During a read cycle, the voltage control circuitry outputs a voltage substantially equal to, or higher than, the input voltage.

In yet another embodiment, in the integrated circuit having two SRAM arrays, the pass gates of each SRAM cell are controlled by word lines. The word line voltage may be controlled by a Vdd periphery power line and a Vss power line. During a write cycle, the word lines may be equal to the voltage on the Vdd periphery power line. During the write cycle, the voltage control circuitry may output a voltage on the cell positive supply CVdd that is lower than the word line voltage. In an embodiment the CVdd line may be between 50 millivolts and 400 millivolts lower than the input voltage.

In a further embodiment, in the integrated circuit having two SRAM arrays of first size cells and second size cells, each of the cross coupled inverters includes a p-type pull up transistor having a source, drain, gate, and bulk terminal. In an embodiment, the bulk terminal is an N-type lightly doped N well. Well strap cells may be arranged in the center of or at the wedges of the SRAM arrays and coupled to a well strap metal line by either contacts, vias or both. In another embodiment, the well strap metal line is connected to a positive voltage supply Vdd periphery.

In another alternative embodiment, the well metal line of the first size SRAM cells is coupled to Vdd periphery and electrically isolated from the cell positive supply voltage CVdd. In yet another embodiment, the well metal line of the second size SRAM cells is coupled to the cell positive supply voltage CVdd for the second array of SRAM cells.

In yet another embodiment, in the above described integrated circuit, the voltage control circuitry for the first SRAM array is a read assist circuit. The voltage control circuitry outputs a voltage on the cell positive supply line CVdd during read cycles that is higher than the input voltage. In an embodiment the voltage on CVdd during reads may be from about 30 millivolts to about 200 millivolts higher than the input voltage.

In a further embodiment, the SRAM cells of the first and second SRAM arrays of the integrated circuit are arranged in rows and columns. Each column of the first SRAM array of the first size SRAM cells has a voltage control circuit coupled to the cell positive voltage supply CVdd. Each column of cells is coupled between a true and a complementary bit line and each column of cells is coupled to at least one negative cell supply CVss.

In yet another embodiment, the integrated circuit having the first and second SRAM array may include a third SRAM array which is a dual port SRAM array. Each of the SRAM cells in the dual port SRAM arrays is a third type cell that has a pair of cross coupled inverters for storing write data on a storage node and a complementary storage node. Each of the third type SRAM cells in the dual port SRAM array has a pair of write pass gates coupled to a true and a complementary write bit line and to the corresponding storage node. Each of the cells in the dual port SRAM array has a read port coupled between one of the true and complementary storage nodes and read bit line. In an embodiment, each of the read ports includes a read pass gate and a read pull down transistor coupled in a series cascade circuit. The read port couples the read bit line to a negative supply voltage CVss, responsive to a read word line signal on the gate of the pass gate and to the voltage on the storage node which is coupled to the gate of the read pull down transistor. The read pass gate and the read pull down transistor are each formed of a multiple fin finFET transistor. In an additional embodiment, the read pass gate and the read pull down transistor may be N-type multiple fin finFET transistors. In yet a further embodiment, other transistors in the dual port SRAM cells may also be formed of multiple fin finFET transistors, while the pull up transistors in the third type SRAM cells are formed of single fin finFET transistors.

In yet another embodiment, in the dual port SRAM array, the cells are arranged in rows and columns. Write assist circuits are provided for each of the columns of the third type dual port SRAM cells. Each write assist circuit receives a positive voltage supply Vdd and outputs the bit line voltage to the write bit lines of the SRAM cells in the column during a write cycle. In additional embodiments, the write assist circuits may output a voltage on the write bit lines than a ground voltage (a negative voltage) as a pulse or wave during a write cycle.

In another embodiment, an integrated circuit includes at least a first single port SRAM array of SRAM cells having a first cell size. Each of the first cell size SRAM cells is formed of a 6T SRAM cell, having a pair of cross coupled inverters coupled to store data on a storage node and a complementary storage node; and each cell is further coupled to a bit line pair of a true and a complementary bit line by pass gates responsive to a voltage on a word line. Each of the transistors in the first cell size SRAM cells is a single fin finFET transistor. Each of the cross coupled inverters of the first cell size SRAM cells includes a p-type pull up transistor coupled between one of the true and complement storage nodes and a cell positive supply CVdd. The SRAM cells in the first SRAM array are arranged in rows and columns. Each column of cells in the first SRAM array includes a write assist circuit for outputting the cell positive supply voltage CVdd.

In the same integrated circuit at least a second single port SRAM array is provided having 6T SRAM cells of a second cell size. The SRAM cells of the second cell size include cross coupled inverters coupled for storing data on a storage node and a complementary storage node, and a pair of pass gates for coupling a pair of bit lines having a true and complementary bit line to the respective storage node, responsive to a word line voltage on the gate terminal of the pass gates. The cross coupled inverters include an n-type pull down transistor and a p-type pull up transistor. The pull up transistors couple a cell positive supply voltage CVdd to a respective one of the storage nodes. The pull down transistors and the pass gates of the second cell size SRAM cells are formed of multiple fin finFET transistors, while the pull up transistors are formed of single fin finFET transistors. The cells of the second SRAM array are also arranged in rows and columns, however, the cell positive voltage supply CVdd is coupled to a predetermined voltage and no write assist circuitry is used in the second SRAM array.

In the integrated circuit described above, the first cell size SRAM cells have a Y direction pitch Y1 and an X direction pitch X1 and the ratio of X1 to Y1 is greater than or equal to about 2. The second cell size SRAM cells have a Y direction pitch Y2 and an X direction pitch X2 and the ratio of X2 to Y2 is greater than or equal to about 3. The ratio of X2 to X1 is greater than about 1.1. The dimensions of X1, X2, Y1, Y2 are determined by the particular design rules for the semiconductor process being used. In a further embodiment, the pitch Y1 is about equal to the pitch Y2.

In the integrated circuit embodiment described above, the write assist circuitry has two states, one for a read cycle and one for a write cycle. In an additional embodiment, during a read cycle the voltage output on the cell positive supply voltage CVdd will be approximately equal to the word line voltage. During a write cycle, in another embodiment, the cell positive supply voltage CVdd will be lower than the voltage on the word lines by between 50 to 300 millivolts.

In yet another embodiment, in the above described integrated circuit, the cells of the first and second SRAM arrays are arranged in rows and columns. Word lines coupled to the pass gates of the SRAM cells will be arranged in parallel to the rows; while the bit line pairs and the positive supply voltage lines that provide CVdd to the cells run in parallel and over the columns of cells. In addition, lines providing the negative power supply CVss to the pull down transistors of the SRAM cells will run in parallel to the columns and over the SRAM cells.

In another embodiment, an integrated circuit is provided including a processor, at least a first single port SRAM array of first sized SRAM cells formed entirely of single fin finFET transistors, and at least a second single port SRAM array of second sized SRAM cells formed including multiple fin finFET transistors; wherein the second sized SRAM cells form a cache memory coupled to the processor.

In a method embodiment, a first array of SRAM cells each formed of single fin finFET transistors is provided in an integrated circuit, and a second array of SRAM cells each including multiple fin finFET transistors is provided in the same integrated circuit, and a voltage control circuit is coupled to the first array. In a method embodiment the voltage control circuit provides a cell positive voltage supply CVdd that is reduced to a voltage lower than a voltage on the word lines during write operations to the first array. In a further embodiment, the method is performed and during a read cycle to the first array, the cell positive voltage supply CVdd is increased to a voltage greater than the voltage on the word lines during the read operation. In yet another embodiment, a method includes providing a reduced cell positive supply voltage CVdd that is lower than an input supply voltage during standby mode of operations to both the cells in the first array and to the cells in the second array.

The scope of the present application is not intended to be limited to the particular illustrative embodiments of the structures, methods and steps described in the specification. As one of ordinary skill in the art will readily appreciate from the disclosure of the example embodiments, processes, or steps, presently existing or later to be developed, that perform substantially the same function or achieve substantially the same result as the corresponding embodiments described herein may be utilized and these alternatives are contemplated as part of the embodiments. Accordingly, the appended claims are intended to include within their scope such processes or steps.

What is claimed is:

1. A method, comprising:
providing a first single port SRAM array on an integrated circuit, the first single port SRAM array comprising a plurality of first size bit cells each comprising:
a cross coupled inverter pair for storing data on a storage node and a complementary storage node each inverter comprising a single fin finFET pull up and a single fin finFET pull down device; and
a pair of pass gates each coupled between a bit line and a complementary bit line and a respective one of the storage node and the complementary storage node, each of the pass gates comprising a single fin finFET device having a gate coupled to a word line;
outputting a first cell positive voltage supply CVdd to the first size bit cells from a first voltage control circuit;
providing a second single port SRAM array on the integrated circuit, the second single port SRAM array comprising a plurality of second size bit cells each comprising:

a cross coupled inverter pair for storing data on a storage node and a complementary storage node, each inverter comprising a single fin finFET pull up and a multiple fin finFET pull down device; and a pair of pass gates each coupled between a bit line and a complementary bit line and a respective one of the storage node and the complementary storage node, each of the pass gates comprising a multiple fin finFET device having a gate coupled to a word line;

outputting a second cell positive voltage supply CVdd to the second size bit cells from a second voltage control circuit;

coupling the first voltage control circuit and the second voltage control circuit to a peripheral voltage Vdd; and operating the first voltage control circuit to vary the first cell positive voltage supply CVdd during selected operations.

2. The method of claim 1, further comprising operating the first voltage control circuit to reduce the first cell positive voltage supply CVdd to a voltage lower than the peripheral voltage Vdd during write operations.

3. The method of claim 1, further comprising operating the first voltage control circuit to output a first cell positive voltage supply CVdd that is equal to or greater than the peripheral voltage Vdd during read operations.

4. The method of claim 1, further comprising operating the first and second voltage control circuits to reduce the first cell positive voltage supply CVdd and the second cell positive voltage supply CVdd during standby operations.

5. The method of claim 1, further comprising providing a third SRAM array, the third SRAM array comprising a plurality of third size bit cell, each of the third size bit cells comprising:

two cross coupled inverters coupled to store data at a storage node and a complementary storage node, each of the cross coupled inverters comprising a p-type single fin finFET pull up transistor coupled between a cell positive supply voltage CVdd and a respective one of the storage node and the complementary storage node, an n-type single fin finFET pull down transistor coupled between a respective one of the storage node and the complementary storage node and a first cell negative supply voltage CVss;

two write pass gates each comprising a single fin finFET transistor having a gate coupled to a word line and coupling a respective one of a write bit line and a complementary write bit line to the corresponding storage node and complementary storage node; and a read port comprising a read pass gate and a read pull down transistor coupled in series between a read bit line and a second cell negative supply voltage CVss, each of the read pass gate and read pull down transistors comprising a multiple fin finFET device.

6. The method of claim 1, wherein each of the plurality of first size bit cells has a y pitch of distance Y1 and an x pitch of distance X1, wherein a ratio of X1 to Y1 is greater than or equal to 2, wherein each of the plurality of second size bit cells has a y pitch of distance Y2 and an x pitch of distance X2, and wherein a ratio of X2 to Y2 is greater than or equal to 3.

7. The method of claim 6, wherein a ratio of X2 to X1 is greater than about 1.1.

8. The method of claim 6, wherein the single fin finFET pull down transistor of each of the plurality of first size bit cells is coupled between a first cell negative voltage supply CVss and the respective one of the storage nodes and complementary storage node, and wherein the multiple fin finFET pull down transistor of each of the plurality of second size bit cells is coupled between a second cell negative voltage supply CVss and the respective one of the storage nodes and the complementary storage node.

9. The method of claim 6, wherein the coupling comprises coupling an input of the first voltage control circuit to the peripheral voltage Vdd and coupling an output of the first voltage control circuit to the first cell positive voltage supply CVdd.

10. The method of claim 6, wherein the coupling comprises coupling an input of the second voltage control circuit to the peripheral voltage Vdd and coupling an output of the second voltage control circuit to the second cell positive voltage supply CVdd.

11. The method of claim 6, wherein the first voltage control circuit is a write assist circuit having an enable input, the enable input having a read state indicating a read cycle and a write state indicating a write cycle.

12. The method of claim 6, further comprising performing a write cycle, wherein during the write cycle, the first cell positive voltage supply CVdd outputted from the first voltage control circuit to the first size bit cells is lower than the peripheral voltage Vdd.

13. The method of claim 6, further comprising performing a read cycle, wherein during the read cycle, the first cell positive voltage supply CVdd outputted from the first voltage control circuit to the first size bit cells is equal to or higher than the peripheral voltage Vdd.

14. The method of claim 6, further comprising:
performing a write cycle, wherein during the write cycle a word line voltage to the first size bit cells is equal to the peripheral voltage Vdd; and
outputting a CVdd voltage from the first voltage control circuit that is lower than the word line voltage by at least 50 millivolts.

15. A method comprising:
providing a first single port SRAM array on an integrated circuit, wherein the first single port SRAM array comprises a plurality of first bit cells arranged in rows and columns, each of the plurality of first bit cells having a y pitch of distance Y1 and an x pitch of distance X1, wherein a ratio of X1 to Y1 is greater than or equal to 2, and wherein each of the plurality of first bit cells forms a 6T SRAM cell of single fin finFET transistors;
providing a first cell positive voltage supply CVdd from a first voltage control circuit to each of the first bit cells;
providing a second single port SRAM array on the integrated circuit, wherein the second single port SRAM array comprises a plurality of second bit cells arranged in rows and columns, each of the plurality of second bit cells having a y pitch of distance Y2 and an x pitch of distance X2, wherein a ratio of X2 to Y2 is greater than or equal to 3, and wherein each of the plurality of second bit cells comprises a 6T SRAM cell including multiple fin finFET transistors; and
providing a second cell positive voltage supply CVdd from a second voltage control circuit to each of the second bit cells,
wherein a ratio of X2 to X1 is greater than about 1.1.

16. The method of claim 15, the method further comprising connecting the first cell positive voltage supply CVdd to the first voltage control circuit, wherein:
each of the first bit cells further comprises:
two inverters cross coupled between a storage node and a complementary storage node, each of the two inverters comprising a single fin finFET pull up transistor coupled between the cell positive voltage supply CVdd and the corresponding one of the storage nodes and a single fin finFET pull down transistor coupled between the respective one of the storage nodes and a cell negative voltage supply CVss; and a pair of pass gates coupled between a respective one of a bit line and a complementary bit line and a corresponding one of the storage node and the complementary storage node, each pass gate comprising a single fin finFET transistor with a gate terminal coupled to a word line; and each of the second bit cells further comprises:

two inverters cross coupled between a storage node and a complementary storage node, each of the two inverters comprising a single fin finFET pull up transistor coupled between the second cell positive voltage supply CVdd and one of the storage nodes and a multiple fin finFET pull down transistor coupled between the respective one of the storage nodes and a cell negative voltage supply CVss; and a pair of pass gates coupled between a respective one of a bit line and a complementary bit line and a corresponding one of the storage node and the complementary storage node, each pass gate further comprising a multiple fin finFET transistor with a gate coupled to a word line.

17. The method of claim 16, wherein the first voltage control circuit is a write assist circuit comprising an input coupled to a periphery Vdd power line, an output coupled to the first cell positive voltage supply CVdd, and an enable input, the enable input having a read state indicating a read cycle and a write state indicating a write cycle.

18. The method of claim 17, further comprising performing a write cycle, wherein during the write cycle, the first voltage control circuit outputs a CVdd voltage lower than the periphery Vdd power line.

19. The method of claim 17, further comprising performing a read cycle, wherein during the read cycle, the first voltage control circuit outputs a CVdd voltage equal to or higher than the periphery Vdd power line.

20. The method of claim 17, further comprising:

performing a write cycle, wherein during the write cycle a word line voltage to the first bit cells is equal to the periphery Vdd power line; and outputting a CVdd voltage from the first voltage control circuit that is lower than the word line voltage by at least 50 millivolts.

* * * * *